United States Patent
Santos et al.

(10) Patent No.: US 7,550,825 B2
(45) Date of Patent: *Jun. 23, 2009

(54) INTERLAYER DIELECTRIC AND PRE-APPLIED DIE ATTACH ADHESIVE MATERIALS

(75) Inventors: Benedicto delos Santos, San Diego, CA (US); James T. Huneke, San Diego, CA (US); Puwei Liu, San Marcos, CA (US); Kang Yang, San Diego, CA (US); Qing Ji, El Monte, CA (US)

(73) Assignee: Henkel Corporation, Rocky Hill, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/758,089

(22) Filed: Jun. 5, 2007

(65) Prior Publication Data
US 2007/0278683 A1    Dec. 6, 2007

Related U.S. Application Data

(62) Division of application No. 10/502,976, filed as application No. PCT/US03/19052 on Jun. 17, 2003, now Pat. No. 7,312,534.

(60) Provisional application No. 60/389,642, filed on Jun. 17, 2002.

(51) Int. Cl.
*H01L 23/58* (2006.01)
(52) U.S. Cl. ..................... 257/642; 257/643
(58) Field of Classification Search ............. 257/642, 257/643
See application file for complete search history.

(56) References Cited

U.S. PATENT DOCUMENTS

| 2,928,446 | A | 3/1960 | James et al. |
| 4,325,985 | A | 4/1982 | Wallace .................. 427/54.1 |
| 4,632,944 | A | 12/1986 | Thompson ................. 522/11 |
| 5,015,695 | A | 5/1991 | Wong ..................... 525/244 |
| 5,140,404 | A | 8/1992 | Fogal et al. ................ 357/70 |
| 5,177,032 | A | 1/1993 | Fogal et al. ............... 437/220 |
| 5,300,608 | A | 4/1994 | Chu et al. ................. 528/14 |
| 5,323,060 | A | 6/1994 | Fogal et al. ............... 257/777 |
| 5,585,671 | A | 12/1996 | Nagash et al. ............. 257/697 |

(Continued)

FOREIGN PATENT DOCUMENTS

CN    1321715 A    11/2001

(Continued)

OTHER PUBLICATIONS

W. Oppolzer and V. Snieckus, "Intramolecular Ene Reactions in Organic Synthesis," *Angew. Chem. For Ed. Engl.*, 17, 476-86 (1978).

*Primary Examiner*—Cathy Lam
(74) *Attorney, Agent, or Firm*—Steven C. Bauman

(57) ABSTRACT

The present invention relates to interlayer dielectric materials and pre-applied die attach adhesives, more specifically pre-applied die attach adhesives (such as wafer and other substrate-applied die attach adhesives), methods of applying the interlayer dielectric materials onto substrates to prepare low K dielectric semiconductor chips, methods of applying the pre-applied die attach adhesives onto wafer and other substrate surfaces, and assemblies prepared therewith for connecting microelectronic circuitry.

10 Claims, 4 Drawing Sheets

U.S. PATENT DOCUMENTS

| | | | |
|---|---|---|---|
| 5,717,034 A | 2/1998 | Dershem et al. | 525/276 |
| 5,744,513 A | 4/1998 | White et al. | 522/116 |
| 5,789,757 A | 8/1998 | Husson, Jr. et al. | 252/183.11 |
| 5,936,026 A | 8/1999 | Huybrechts et al. | 524/504 |
| 5,973,166 A | 10/1999 | Mizori et al. | 548/548 |
| 6,034,194 A | 3/2000 | Dershem et al. | 526/262 |
| 6,034,195 A | 3/2000 | Dershem et al. | 526/262 |
| 6,187,886 B1 | 2/2001 | Husson, Jr. et al. | 526/262 |
| 6,465,893 B1 | 10/2002 | Khandros et al. | 257/777 |
| 6,580,155 B1 * | 6/2003 | Muroyama | 257/639 |
| 6,743,852 B2 * | 6/2004 | Dershem et al. | 524/548 |
| 6,831,132 B2 * | 12/2004 | Liu et al. | 525/193 |
| 6,861,670 B1 * | 3/2005 | Ohtani et al. | 257/66 |
| 6,953,984 B2 * | 10/2005 | Grill et al. | 257/642 |
| 6,960,636 B2 * | 11/2005 | Dershem et al. | 526/262 |
| 6,963,001 B2 * | 11/2005 | Dershem et al. | 548/435 |
| 7,176,044 B2 * | 2/2007 | Forray et al. | 438/15 |
| 2003/0087479 A1 | 5/2003 | He et al. | 438/113 |

FOREIGN PATENT DOCUMENTS

| | | |
|---|---|---|
| EP | 0 970 946 A2 | 7/1999 |
| EP | 1146065 A1 | 10/2001 |
| JP | 03095225 A | 4/1991 |
| WO | PCT/US00/07494 | 9/2000 |

\* cited by examiner

INTERLAYER DIELECTRIC AND PRE-APPLIED DIE ATTACH ADHESIVE MATERIALS

CROSS REFERENCE TO RELATED APPLICATIONS

This application is a division of U.S. patent application Ser. No. 10/502,976, filed Jul. 30, 2004 now U.S. Pat. No. 7,312,534, which claims the benefit of an earlier filing date from International Patent Application No. PCT/US2003/19052, filed Jun. 17, 2003, which claims the benefit of an earlier filing date from U.S. Provisional Application No. 60/389,642, filed Jun. 17, 2002.

BACKGROUND OF THE INVENTION

1. Field of the Invention

The present invention relates to interlayer dielectric materials and pre-applied die attach adhesives, more specifically pre-applied die attach adhesives (such as wafer and other substrate-applied die attach adhesives), methods of applying the interlayer dielectric materials onto substrates to prepare low K dielectric semiconductor chips, methods of applying the pre-applied die attach adhesives onto wafer and other substrate surfaces, and assemblies prepared therewith for connecting microelectronic circuitry.

2. Brief Description of Related Technology

Bismaleimides occupy a prominent position in the spectrum of thermosetting resins, and a number of bismaleimides are commercially available. Bismaleimides have been used for the production of moldings and adhesive joints, heat-resistant composite materials, and high temperature coatings. More recently, Henkel Loctite Corporation has commercialized a number of products based in part on certain bismaleimides for the attachment of semiconductor chips to circuit boards, which have received favorable responses from within the microelectronic packaging industry. These products are described in one or more of U.S. Pat. No. 5,789,757 (Husson), U.S. Pat. No. 6,034,194 (Dershem), U.S. Pat. No. 6,034,195 (Dershem) and U.S. Pat. No. 6,187,886 (Husson).

Low-k dielectric materials (or interlayer dielectrics, "ILD's") play an important role in the future development of advanced integrated circuit manufacturing, enabling the application of copper interconnects in sub-0.18 micron fabrication processes. ILD's are used in integrated circuit manufacturing to insulate copper interconnects from their surroundings, ensuring less cross talk between interconnections. Cross talk is a common problem in integrated circuit manufacturing, as it causes malfunctions in the circuit. Cross talk becomes even more pronounced as the integrated circuit continues to be designed smaller and smaller. And ILD's are an important aspect of this design trend to maximize the efficiency of ever more compact Integrated circuits.

Many in the industry even view ILD's as a potential successor to silicon oxide insulators. Little progress has been reported to date, however, at reducing the internal package stresses that lead to the ILD cracking failures.

It would be desirable therefore to provide ILD's with superior dielectric properties to minimize cross talk. In addition, it would be desirable to provide electronic packages assembled with such ILD's and methods of manufacturing such electronic packages that provide enhanced physical properties.

It would also be desirable to provide die attach adhesive materials in a pre-applied form, such as a wafer-applied or substrate-applied version thereof. Such a version would eliminate many of the storage, dispensing, handling and processing issues that exist when dispensing in a flowable form reactive adhesives, including die attach adhesive materials.

In addition, in more extreme environments, such as those elevated temperature conditions to which a semiconductor device may be exposed during the solder reflow cycle where a lead free solder is used to establish electrical interconnection, it would be desirable to use in the pre-applied die attach adhesive material a material which is even more robust than the maleimides to which reference is made above.

Pre-applied adhesives themselves are not a new commercial product. For instance, Henkel Loctite has a substantial business in pre-applied threadlocker adhesives, which involve (meth)acrylate chemistry, for use in connection with nut and bolt assemblies, curable by either a photocure mechanism, a heat cure mechanism, or combinations thereof, with an optional secondary anaerobic cure mechanism. See also International Patent Application No. PCT/US00/107494; and U.S. Pat. Nos. 2,928,446, 4,325,985, 4,632,944 and 5,300,608.

However, to date there has not been an article of manufacture placed in commerce, such as a semiconductor chip or a semiconductor wafer, with a die attach adhesive material pre-applied thereon for application without the Intermediate process steps attendant with a flowable die attach adhesive material, particularly where the reactive component of the adhesive material is based in whole or in part on a bismaleimide or for more extreme environments where the reactive component of the die attach adhesive material is based in whole or in part on a benzoxazine.

SUMMARY OF THE INVENTION

The present invention in one aspect is directed to an article of manufacture, and in particular, a semiconductor chip (or a chip die) provided for attachment to and electrical interconnection with a carrier substrate. The semiconductor chip has a first surface and a second surface, with the first surface having electrical contacts arranged in a predetermined pattern thereon for providing electrical engagement with a carrier substrate, and with the second surface having a pre-applied die attach adhesive material disposed on a layer or a portion thereof, preferably as a film.

Alternatively, the semiconductor chip may be in a wafer form; that is, in a bulk form, from which individual semiconductor chips may be diced from the wafer.

In one embodiment of this aspect of the invention, the die attach adhesive material desirably includes a maleimide-, itaconamide- or nadimide-containing compound in liquid form or solid form, which when in liquid form is used in combination with a thermoplastic elastomer and when in solid form optionally includes the thermoplastic elastomer. The die attach adhesive material may include additional materials that are either co-curable with the maleimide-, itaconamide- or nadimide-containing compound, such as a (meth)acrylate-functionalized material, a vinyl-functionalized material, a vinyl ether-functionalized material and the like.

When a maleimide-, itaconamide- or nadimide-containing compound is used in liquid form is in the pre-applied die attach adhesive material, it may be B-staged, such as by exposure to radiation in electromagnetic spectrum, to render it non-flowable prior to ultimate cure.

As noted, the die attach adhesive material may include maleimide-, itaconamide- or nadimide-containing compound, in a liquid form or a solid form.

Like Henkel Loctite's bismaleimide die attach adhesive materials that are sold in liquid form, the Inventive pre-applied die attach adhesive materials produce cured die attach composition exhibiting a combination of highly desirable physical properties, including rapid curing, low water absorption and low dielectric constant. And the inventive articles of manufacture pre-applied with the type of adhesive materials generally referred to above have the added advantage of being useful without the ordinary processing steps taken when working with a flowable adhesive material, otherwise designed for similar applications.

In another aspect of the invention, the die attach adhesive material desirably includes a benzoxazine-containing compound.

The present invention provides advantages relating to the avoidance of dispensing, handling and storage issues for the end user seeking to assemble in particular microelectronic devices using a semiconductor chip having an adhesive material pre-applied to a surface thereof.

The invention further provides a method for assembling a semiconductor device, which includes providing an semiconductor chip with such a die attach adhesive material, mating the semiconductor chip with a carrier substrate to form a mated assembly; and exposing the mated assembly to temperature conditions sufficient to cure the die attach adhesive material, thereby adhering the semiconductor chip to the carrier substrate. Alternatively or additionally, the die attach material may be pre-applied onto one or more metallized contact, or bond, pads located on the carrier substrate, such as another chip die or a circuit board. The curing conditions for a maleimide-, itaconamide- or nadimide-containing pre-applied die attach adhesive material in accordance with this invention may involve exposure to a temperature in the range of about 150° C. up to about 200° C. for a period of time of about 0.25 minutes up to about 2 minutes.

In addition, in another aspect the invention provides interlayer dielectric materials, based either on maleimide-, itaconamide- or nadimide-containing compounds or on benzoxazine-containing compounds, and semiconductor chips manufactured therewith.

DETAILED DESCRIPTION OF THE INVENTION

Figure 1:
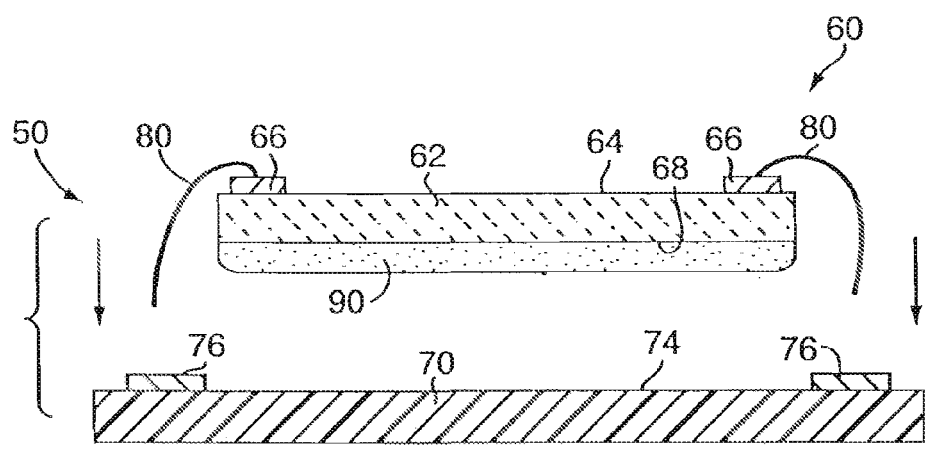
FIG. 1 is a schematic representation of a pre-applied die attach semiconductor chip in one embodiment of the present invention, prior to assembly with a substrate.
Figure 2:
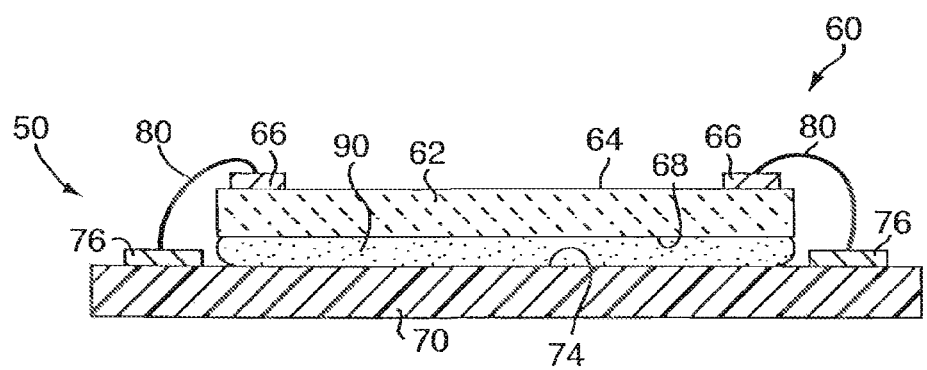
FIG. 2 is a schematic representation of a circuit assembly including the semiconductor chip of FIG. 1 assembled to a substrate.

Referring to the drawings in which like reference characters refer to like parts throughout the several views thereof, a pre-applied die attach adhesive material is shown and described in connection with a circuit assembly 50, as depicted in FIGS. 1 and 2. Generally speaking, circuit assembly 50 includes a semiconductor chip in the form of pre-applied die attach circuit chip 60, and a carrier substrate, such as circuit board substrate circuit 70.

The pre-applied die attach circuit chip 60 may be attached to carrier substrates other than a circuit board substrate, such as a heat slug or heat sink, or a heat spreader. The heat slug, heat sink or heat spreader may be constructed at least in part from materials used for dissipating heat, such as AlSiC, anodized aluminum and the like.

Circuit chip 60 includes a chip die 62. Semiconductor chip, or chip die, 62 may be constructed of any material known in the art, as silicon, germanium, or the like. Chip die 62 may also be coated with a material, which is capable of passivating environmental corrosion, such as a polyimide-, polybenzocyclobutane-, or silicon nitride-based material. The is passivation coating is not shown in FIG. 1 or 2.

Substrate 70 may also be constructed of any material known in the art, such as ceramic substrates including $Al_2O_3$, $SiN_3$, and $Al_2O_3$—$SiO_2$; substrates or tapes of heat-resistant resins, such as polyimides; substrates of glass-reinforced epoxy; substrates off acrylonitrile-butadiene-styrene ("ABS"); phenolic substrates, and the like. Substrate 70 includes circuitry on a substrate surface 74, including a plurality of electrical contact pads 76.

Chip die 62 includes opposing first and second surfaces, including chip surface 64 as a first surface and attach surface 68 as a second surface. Circuitry is provided on chip surface 64, including a plurality of electrical contact pads, such as metallized contact pads 66, which are arranged in a predetermined pattern. These electrical contact pads are connectable to the contact pads 76 of the substrate 70. The electrical interconnection and engagement between the circuitry on chip die 62 and the circuitry on substrate 70 is provided by way of bonds between each of contact pads 66 on chip die 62 and contact pads 76 of substrate 70, established such as by wire(s) 80. Electrical interconnection can be established by bonding wire 80 to contact pads 76 before or, more preferably, after curing of the die attach material. While the present figures depict two wires 80 bonded on chip die 62 and two corresponding contact pads 76 on substrate 70 for purposes of demonstrating the present invention, it is understood that the number of wire bonds and contact pads 76 may be varied according to the particular desired use and the particular configuration of the circuit chip, and the specific configuration depicted herein should not be considered as limiting of the present invention.

In the present invention, chip die 62 includes metallized electrical contacts in the form of contact pads 66 on chip surface 64, and includes die attach adhesive material 90 pre-applied on the opposing attach surface 68 prior to assembly of chip die 62 with substrate 70.

The electrical conductor may be bumps, and the solder may be substantially free of lead, as is the growing trend in the industry. Pre-applied die attach adhesive material 90 provides circuit assembly 50, after exposure to appropriate curing conditions, with high adhesive strength for adhering chip die 62 to substrate 70. Ordinarily, such adherence occurs by forming a fully cured material in a solid form for attaching and adhering chip die 62 to substrate 70, through exposure to elevated temperature conditions sufficient to promote curing of the die attach material 90.

The present invention further provides circuit assembly 50 in an assembled form, as depicted in FIG. 2, in which chip die 62 has been mated with substrate 70, and exposed to appropriate conditions to cause die attach material 90 to attach and adhere chip die 62 to substrate 70. Also, chin die 62 can then be electrically interconnected with substrate 70 through an electrical interconnection established between contact pads 66 and contact pads 76, such as by soldering or otherwise bonding wires 80 therebetween.

The present invention thus provides, in one embodiment, an article of manufacture in the form of a circuit chip having a first surface capable of providing electrical engagement with a carrier substrate to which it is intended to be electrically interconnected, and a second surface, opposed from the first, and having a pre-applied die attach adhesive material disposed on at least a portion thereof. Providing the die attach adhesive material directly onto a surface of the chip die, eliminates production issues with dispensing volumes and temperatures, and storage, handling and shelf life issues, as well. That is, the end user of the pre-applied die attach adhesive material no longer needs to use sophisticated dispensing equipment and low temperature storage containers for application of such materials. Instead, the end user can now use either a semiconductor chip or a semiconductor wafer with die attach adhesive material preapplied onto at least a portion of a surface thereof, according to the invention and assemble the semiconductor device with increased ease and throughput.

A semiconductor chip pre-applied with a die attach adhesive material also enables the end user to implement tighter package design criteria. That is, because of reduced flowout and bleed from such pre-applied die attach adhesive materials as contrasted to known adhesives, tighter tolerances between die edge and bond may be realized. In addition, semiconductor chips may now be more readily stacked [see e.g., U.S. Pat. No. 5,140,404 (Fogal), U.S. Pat. No. 5,177,632 (Fogal), U.S. Pat. No. 5,323,060 (Fogal) and U.S. Pat. No. 6,465,893 (Khandros)], such that the overall size of the semiconductor device may be reduced, or at least remain substantially the same in the length and width directions, yet the performance capabilities of the stacked semiconductor chips may be increased dramatically. (See FIGS. 8 and 10.)

Moreover, whereas a conventional die attach adhesive material requires tighter controls to avoid kerf creep and contact bond pad contamination during bonding of thin dice, no such precautions are necessary when pre-applied die attach adhesives are used.

The pre-applied adhesive material may also be used to replace the solder mask coating over the die pad, i.e., the pre-applied adhesive serves both as a carrier substrate, such as a circuit board, protector and as an adhesive. Since the thickness of die stackup is thinner by the amount of the solder mask thickness, this approach enable even thinner semiconductor device packages to be manufactured.

The die attach material is pre-applied either (a) onto at least a portion of the opposed surface of the circuit chip (FIG. 1) or (b) onto at least a portion of the carrier substrate between electrical contact pads 76 (FIG. 9), at any thickness or amount which can achieve sufficient adhesion between the chip die and the substrate and which provides for appropriate properties therebetween during use of the thus integrated assembly.

The pre-applied die attach material may in one aspect of the invention be a thermosetting resin composition which includes in one embodiment a maleimide-containing compound in liquid form, such as is described and claimed in U.S. Pat. No. 5,789,757 (Husson), U.S. Pat. No. 6,034,194 (Dershem), U.S. Pat. No. 6,034,195 (Dershem) and U.S. Pat. No. 6,187,886 (Husson), the disclosures of each of which are hereby incorporated herein by reference. In another embodiment, pre-applied die attach material includes an itaconamide- or nadimide-containing compound.

As noted above, the pre-applied die attach adhesive material may include additional materials that are co-curable with the maleimide-, itaconamide- or nadimide-containing compound, such as a (meth)acrylate-functionalized material, a vinyl-functionalized material, a vinyl ether-functionalized material and the like, and/or thermoplastic elastomers that aid in forming a film when mixed with the maleimide-, itaconamide- or nadimide-containing compound.

Described here in the context of a pre-applied die attach semiconductor chip (rather than for instance a stacked die application or pre-applied die attach carrier substrate), prior to disposal onto the second surface of the semiconductor chip or wafer, the die attach adhesive material should be in the flowable form. Thus, when a maleimide-, itaconamide- or nadimide-containing compound is used that is in liquid form, the resulting die attach adhesive material should be flowable. When a maleimide-, itaconamide- or nadimide-containing compound is used in solid form, it is desirable to either warm the semiconductor chip or the wafer the die attach adhesive material, or to mix with a diluent, either of the reactive or inert variety, to form a solution of dispersion thereof and then dispose such solution or dispersion onto the second surface of the semiconductor chip or wafer.

The pre-applied die attach adhesive material may also include at least one cure initiator for the maleimide-, itaconamide- or nadimide-containing compound.

The maleimides, nadimides, and itaconimides include those compounds having the following structures I, II and III, respectively

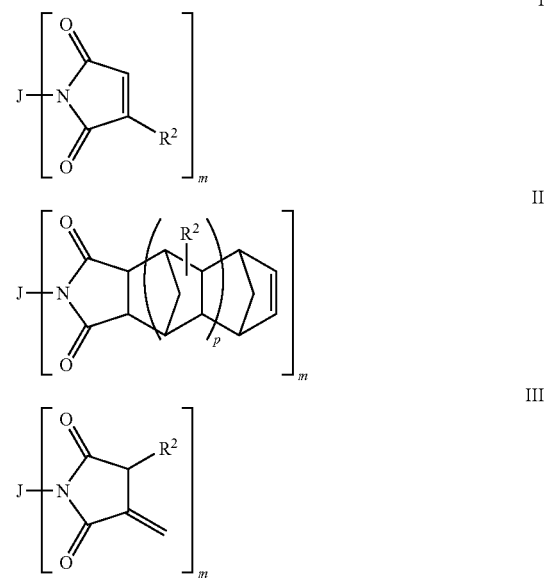

where:
m=1-15,
p=0-15, each $R^2$ is independently selected from hydrogen or lower alkyl, and J is a monovalent or a polyvalent moiety comprising organic or organosiloxane radicals, and combinations of two or more thereof.

More specific representations of the maleimides, itaconimides and nadimides include those corresponding to structures I, II, or III, where m=1-6, p=0, $R^2$ is independently selected from hydrogen or lower alkyl, and J is a monovalent or polyvalent radical selected from hydrocarbyl, substituted hydrocarbyl heteroatom-containing hydrocarbyl, substituted heteroatom-containing hydrocarbyl, hydrocarbylene, substituted hydrocarbylene, heteroatom-containing hydrocarbylene, substituted heteroatom-containing hydrocarbylene, polysiloxane, polysiloxane-polyurethane block copolymer, and combinations of two or more thereof, optionally containing one or more linkers selected from a covalent bond, —O—, —S—, —NR—, —O—C(O)—, —O—C(O)—O—, —O—C(O)—NR—, —NR—C(O)—, —NR—C(O)—O—, —NR—C(O)—NR—, —S—C(O)—, —S—C(O)—O—, —S—C(O)—NR—, —S(O)—, —S(O)$_2$—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—, —O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$—, —S—P(O)R$_2$—, —NR—P(O)R$_2$—, where each R is independently hydrogen, alkyl or substituted alkyl, and combinations of any two or more thereof.

When one or more of the above described monovalent or polyvalent groups contain one or more of the above described linkers to form the "J" appendage of a maleimide, nadimide or itaconimide group, as readily recognized by those of skill in the art, a wide variety of linkers can be produced, such as, for example, oxyalkyl, thioalkyl, aminoalkyl, carboxylalkyl, oxyalkenyl, thioalkenyl, aminoalkenyl, carboxyalkenyl, oxyalkynyl, thioalkynyl, aminoalkynyl, carboxyalkynyl, oxycycloalkyl, thiocycloalkyl, aminocycloalkyl, carboxycycloalkyl, oxycloalkenyl, thiocycloalkenyl, aminocycloalkenyl, carboxycycloalkenyl, heterocyclic, oxyheterocyclic, thioheterocyclic, aminoheterocyclic, carboxyheterocyclic, oxyaryl, thioaryl, aminoaryl, carboxyaryl, heteroaryl, oxyheteroaryl, thioheteroaryl, aminoheteroaryl, carboxyheteroaryl, oxyalkylaryl, thioalkylaryl, aminoalkylaryl, carboxyalkylaryl, oxyarylalkyl, thioarylalkyl, aminoarylalkyl, carboxyarylalkyl, oxyarylalkenyl, thioarylalkenyl, aminoarylalkenyl, carboxyarylalkenyl, oxyalkenylaryl, thioalkenylaryl, aminoalkenylaryl, carboxyalkenylaryl, oxyarylalkynyl, thioarylalkynyl, aminoarylalkynyl, carboxyarylalkynyl, oxyalkynylaryl thioalkynylaryl, aminoalkynylaryl or carboxyalkynylaryl, oxyalkylene, thioalkylene, aminoalkylene, carboxyalkylene, oxyalkenylene, thioalkenylene, aminoalkenylene, carboxyalkenylene, oxyalkynylene, thioalkynylene, aminoalkynylene, carboxyalkynylene, oxycycloalkylene, thiocycloalkylene, aminocycloalkylene, carboxycycloalkylene oxycycloalkenylene, thiocycloalkenylene, aminocycloalkenylene, carboxycloalkenylene, oxyarylene, thioarylene, aminoarylene, carboxyarylene, oxyalkylarylene, thioalkylarylene, aminoalkylarylene, carboxyalkylarylene, oxyarylalkylene, thioarylalkylene, aminoarylalkylene, carboxyarylalkylene, oxyarylalkenylene, thioarylalkenylene, aminoarylalkenylene, carboxyarylalkenylene, oxyalkenylarylene, thioalkenylarylene, aminoalkenylarylene, carboxyalkenylarylene, oxyarylalkynylene, thioarylalkynylene, aminoarylalkynylene, carboxy arylalkynylene, oxyalkynylarylene, thioalkynylarylene, aminoalkynylarylene, carboxyalkynylarylene, heteroarylene, oxyheteroarylene, thioheteroarylene, aminoheteroarylene, carboxyheteroarylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, carboxyheteroatom-containing di- or polyvalent cyclic moiety, disulfide, sulfonamide, and the like.

In another embodiment, maleimides, nadimides, and itaconimides contemplated for use in the practice of the present invention have the structures I, II, and III, where m=1-6, p=0-6, and J is selected from saturated straight chain alkyl or branched chain alkyl, optionally containing optionally substituted aryl moieties as substituents on the alkyl chain or as part of the backbone of the alkyl chain, and where the alkyl chains have up to about 20 carbon atoms;

a siloxane having the structure: —(C(R$^3$)$_2$)$_d$—[Si(R$^4$)$_2$—O]$_f$—Si(R$^4$)$_2$—(C(R$^3$)$_2$)$_e$—, —(C(R$^3$)$_2$)$_d$—C(R$^3$)—C(O)O—(C(R$^3$)$_2$)$_d$—[Si(R$^4$)$_2$—O]$_f$—Si(R$^4$)$_2$—(C(R$^3$)$_2$)$_e$—O(O)C—(C(R$^3$)$_2$)$_e$—, or —(C(R$^3$)$_2$)$_d$—C(R$^3$)—O(O)C—(C(R$^3$)$_2$)$_d$—[Si(R$^4$)$_2$—O]$_f$—Si(R$^4$)$_2$—(C(R$^3$)$_2$)$_e$—C(O)O—(C(R$^3$)$_2$)$_e$—, where:

each $R^3$ is independently hydrogen, alkyl or substituted alkyl, each $R^4$ is independently hydrogen, lower alkyl or aryl, d=1-10, e=1-10, and f=1-50;

a polyalkylene oxide having the structure:

$$[(CR_2)_r—O—]_f—(CR_2)_s—$$

where:

each R is independently hydrogen, alkyl or substituted alkyl, r=1-10, s=1-10, and f is as defined above;

aromatic groups having the structure:

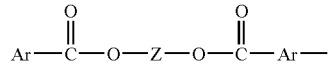

where:

each Ar is a monosubstituted, disubstituted or trisubstituted aromatic or heteroaromatic ring having in the range of 3 up to 10 carbon atoms, and Z is:

saturated straight chain alkylene or branched chain alkylene, optionally containing saturated cyclic moieties as substituents on the alkylene chain or as part of the backbone of the alkylene chain, or polyalkylene oxides having the structure:

$$—[(CR_2)_r—O—]_q—(CR_2)_s—$$

where:
each R is independently hydrogen, alkyl or substituted alkyl, r and s are each defined as above, and
q falls in the range of 1 up to 50;
di- or tri-substituted aromatic moieties having the structure:

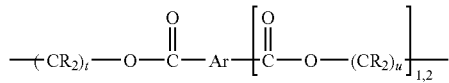

where:
each R is independently hydrogen, alkyl or substituted alkyl,
t falls in the range of 2 up to 10,
u falls in the range of 2 up to 10, and
Ar is as defined above;
aromatic groups having the structure:

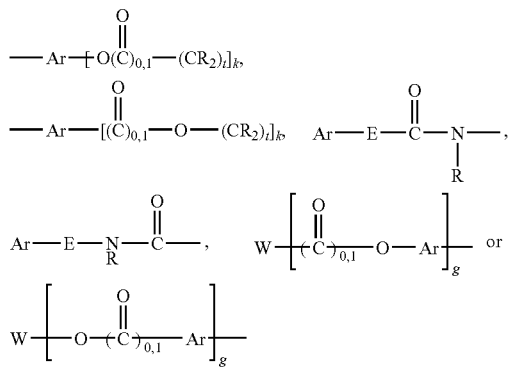

where:
each R is independently hydrogen, alkyl or substituted alkyl,
t=2-10,
k=1, 2 or 3,
g=1 up to about 50,
each Ar is as defined above,
E is —O— or —NR$^5$—, where R$^5$ is hydrogen or lower alkyl; and
W is straight or branched chain alkyl, alkylene, oxyalkylene, alkenyl, alkenylene, oxyalkenylene, ester, or polyester, a siloxane having the structure —(C(R$^3$)$_2$)$_d$—[Si(R$^4$)$_2$—O]$_f$—Si(R$^4$)$_2$—(C(R$^3$)$_2$)$_e$—, —(C(R$^3$)$_2$)$_d$—C(R$^3$)—C(O)O—(C(R$^3$)$_2$)$_d$—[Si(R$^4$)$_2$—O]$_f$—Si(R$^4$)$_2$—(C(R$^3$)$_2$)$_e$—O(O)C—(C(R$^3$)$_2$)$_e$—, or —(C(R$^3$)$_2$)$_d$—C(R$^3$)—O(O)C—(C(R$^3$)$_2$)$_d$—[Si(R$^4$)$_2$—O]$_f$—Si(R$^4$)$_2$—(C(R$^3$)$_2$)$_e$—C(O)O—(C(R$^3$)$_2$)$_e$—, where;
each R$^3$ is independently hydrogen, alkyl or substituted alkyl,
each R$^4$ is independently hydrogen, lower alkyl or aryl,
d=1-10,
e=1-10, and
f=1-50;
a polyalkylene oxide having the structure:

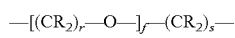

where:
each R is independently hydrogen, alkyl or substituted alkyl,
r=1-10,
s=1-10, and
f is as defined above;
optionally containing substituents selected from hydroxy, alkoxy, carboxy, nitrile, cycloalkyl or cycloalkenyl;
a urethane group having the structure:

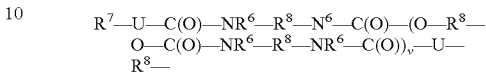

where:
each R$^6$ is independently hydrogen or lower alkyl,
each R$^7$ is independently an alkyl, aryl, or arylalkyl group having 1 to 18 carbon atoms,
each R$^8$ is an alkyl or alkyloxy chain having up to about 100 atoms in the chain, optionally substituted with Ar,
U is —O—, —S—, —N(R)—, or —P(L)$_{1,2}$—,
where R as defined above, and where each L is independently =O, =S, —OR or —R; and
v=0-50;
polycyclic alkenyl; or mixtures of any two or more thereof.

When in the liquid state, the maleimide-, nadimide- and/or itaconimide-containing compounds have functional group attached to a monovalent radical, J, or separated by a polyvalent radical, J, each of the monovalent radical or the polyvalent radical having sufficient length and branching to render the maleimide-, nadimide- and/or itaconimide-containing compound a liquid.

In a more specific recitation of such maleimide-, nadimide-, and Itaconimide-containing compounds of structures I, II and III, respectively, each R is independently hydrogen or lower alkyl, -J- comprises a branched chain alkyl, alkylene, alkylene oxide, alkylene carboxyl or alkylene amido species having sufficient length and branching to render the maleimide, nadimide and/or itaconimide compound a liquid, and m is 1, 2 or 3.

The maleimide-containing compound may be chosen from those described and claimed in U.S. Pat. No. 5,789,757 (Husson), U.S. Pat. No. 6,034,194 (Dershem), U.S. Pat. No. 6,034,195 (Dershem) and U.S. Pat. No. 6,187,886 (Husson), the disclosures of each of which are hereby incorporated herein by reference, and those described by U.S. Pat. No. 6,063,828 (Ma), U.S. Pat. No. 6,265,530 (Herr), U.S. Pat. No. 6,281,314 (Tong) and U.S. Pat. No. 6,316,566 (Ma), the disclosures of each of which are hereby incorporated herein by reference, as well.

As employed herein,
"alkyl" refers to hydrocarbyl radicals having 1 up to about 20 carbon atoms, preferably 2-10 carbon atoms; and "substituted alkyl" comprises alkyl groups further bearing one or more substituents selected from hydroxy, alkoxy, mercapto, cycloalkyl, substituted cycloalkyl, heterocyclic, substituted heterocyclic, aryl, substituted aryl, heteroaryl, substituted heteroaryl, aryloxy, substituted aryloxy, halogen, cyano, nitro, amino, amido, C(O)H, acyl, oxyacyl, carboxyl, carbamate, sulfonyl sulfonamide, sulfuryl, and the like;
"cycloalkyl" refers to cyclic ring-containing groups containing in the range of 3 up to about 8 carbon atoms, and "substituted cycloalkyl" refers to cycloalkyl groups further bearing one or more substituents as set forth above;
"alkenyl" refers to straight or branched chain hydrocarbyl groups having at least one carbon-carbon double bond, and having in the range of 2 up to about 12 carbon atoms, and "substituted alkenyl" refers to alkenyl groups further bearing one or more substituents as set forth above;

"cycloalkenyl" refers to cyclic ring-containing groups containing in the range of 3 up to about 8 carbon atoms, and "substituted cycloalkenyl" refers to cycloalkenyl groups further bearing one or more substituents as set forth above;

"alkylene" refers to divalent hydrocarbyl radicals having 1 up to about 20 carbon atoms, preferably 2-10 carbon atoms and "substituted alkylene" comprises alkylene groups further bearing one or more substituents as set forth above;

"oxyalkylene" refers to an alkylene moiety wherein one or more of the methylene units of the alkylene moiety has been replaced with an oxygen atom;

"aryl" refers to aromatic groups having in the range of 6 up to about 14 carbon atoms and "substituted aryl" refers to aryl groups further bearing one or more substituents as set forth above;

"alkenylene" refers to divalent, straight or branched chain hydrocarbyl groups having at least one carbon-carbon double bond, and having in the range of 2 up to about 12 carbon atoms, and "substituted alkenylene" refers to alkenylene groups further bearing one or more substituents as set forth above; and "oxyalkenylene" refers to an alkenylene moiety wherein one or more of the methylene units of the alkenylene moiety has been replaced with an oxygen atom.

Particularly desirable maleimides compounds for use in the pre-applied die attach adhesive material or interlayer dielectric materials contemplated for use in the practice of the present invention include, for example, maleimides having the following structures:

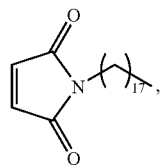

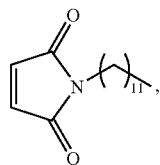

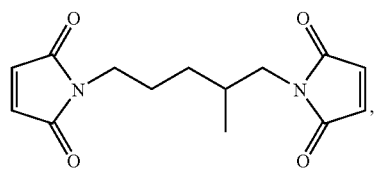

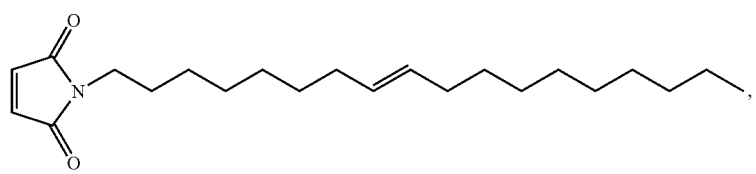

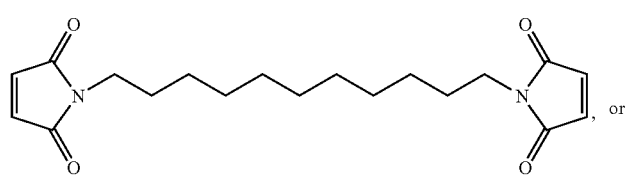

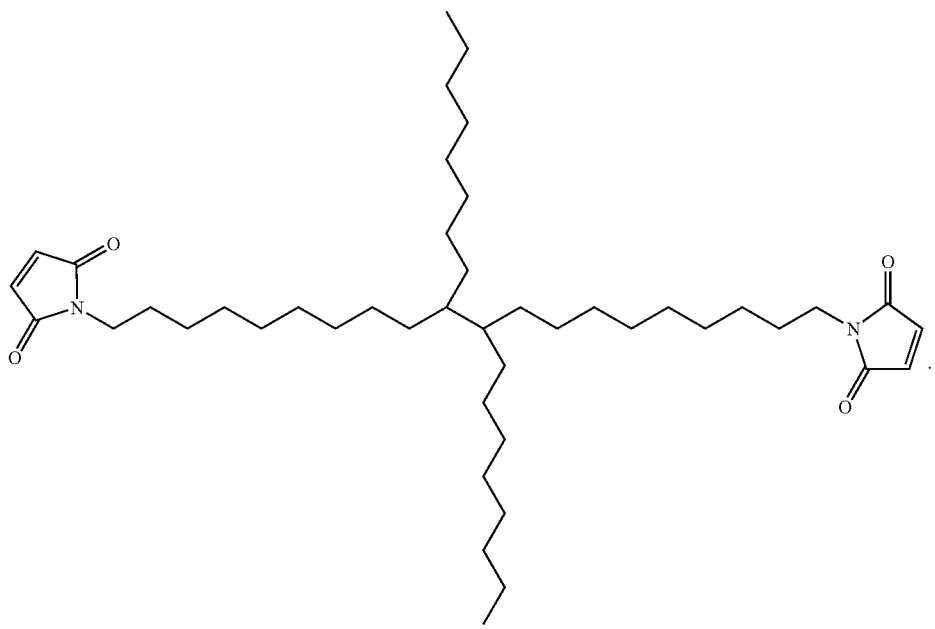

Preferred maleimide resins of structure I include stearyl maleimide, oleyl maleimide and behenyl maleimide, 1,20-bismaleimido-10,11-di-octyl-eicosane, and the like, as well as combinations thereof.

In another aspect of the invention, the pre-applied die attach adhesive material may include a benzoxazine-containing compound.

Where the pre-applied die attach adhesive material includes a benzoxazine-containing compound, the pre-applied die attach adhesive material may also include (ii) an epoxy resin or episulfide resin component; (iii) one or more of an oxazoline component, a cyanate ester component, a phenolic component, a thiophenolic component, an acrylonitrile-butadiene copolymer component, polyimide component, and a polyimide/siloxane component, and (iv) optionally, a curative. When these additional components are employed together with the benzoxazine in the pre-applied die attach adhesive material, it is particularly desirable that where an epoxy is present, component (iii) is present and is not solely a phenolic component.

The benzoxazine may be chosen from a host of materials including:

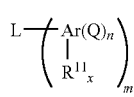
IV where:
L is an optional spacer, such as an alkylene or a siloxane linking moiety, hydrogen, a direct bond, O, C=O, S, O=S=O, C, CH, CH$_2$, CR$^9$R$^{10}$ and R$^9$ and R$^{10}$ are alkyl, halogen substituted alkyl, aryl or alkaryl;
Ar is optionally substituted arylene;
Q is an oxazine ring or amine salt thereof having the structure:

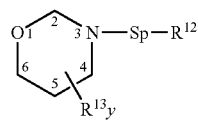
V and is bonded to Ar in a fused manner at positions 5 and 6 of the oxazine ring,
where:
Sp is optional, and if present, is a C$_1$ to C$_6$ alkylene spacer,
n is 1 or 2,
m is optional, and if present, is 1 to 4,
x and y are each independently 0 to 4, and
at least one of R$^{11}$, R$^{12}$, or R$^{13}$ is a polymerizable moiety, such as a benzoxazine represented by L-(Ar(Q$_n$))$_m$.

The benzoxazine may also be embraced by structure:

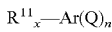
VI where:
Ar is optionally substituted arylene,

Q is an oxazine ring or amine salt thereof having the structure:

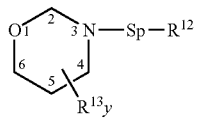

V and is bonded to Ar in a fused manner at positions 5 and 6 of the oxazine ring, Sp is optional, and if present, is a $C_1$ to $C_6$ alkylene spacer, n is 1 or 2, x and y are each independently 0 to 4, and at least one of $R^{11}$, $R^{12}$, or $R^{13}$ is a polymerizable moiety.

In addition, the benzoxazine may be embraced by

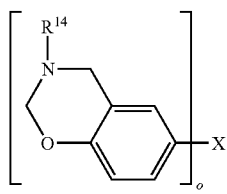

VII where o is 1-4, X is a direct bond (when o is 2), alkyl (when o is 1), alkylene (when o is 2-4), carbonyl (when o is 2), thiol (when o is 1), thioether (when o is 2), sulfoxide (when o is 2), and sulfone (when o is 2), and $R^{14}$ is alkyl, such as methyl, ethyl, propyls and butyls, or aryl.

In a more specific embodiment, the benzoxazine component is embraced by

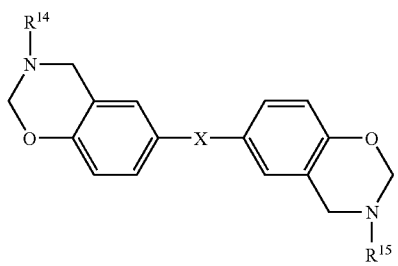

VIII where X is selected from the group consisting of a direct bond, $CH_2$, $C(CH_3)_2$, C=O, S=O and O=S=O, S, and $R^{14}$ and $R^{15}$ are the same or different and are selected from methyl, ethyl, propyls, or butyls and aryl.

In yet a more specific embodiment, the benzoxazine component is embraced by

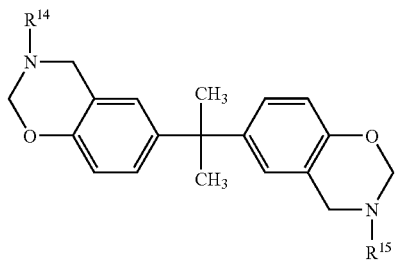

IX where $R^{14}$ and $R^{15}$ are the same or different and are selected from methyl, ethyl, propyls, butyls or aryl.

The benzoxazine component may include one or more of

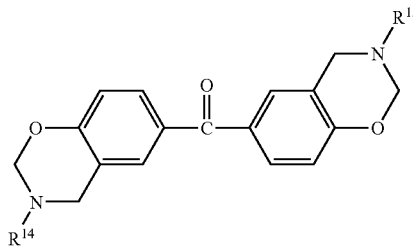

X

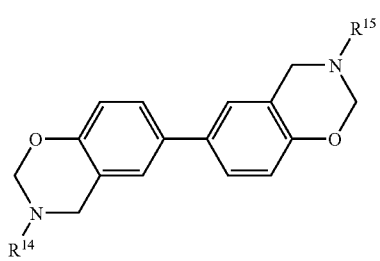

XI

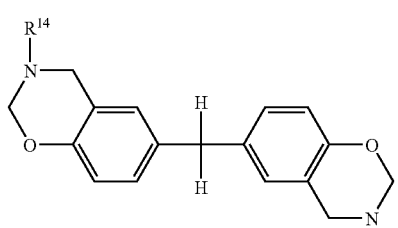

XII

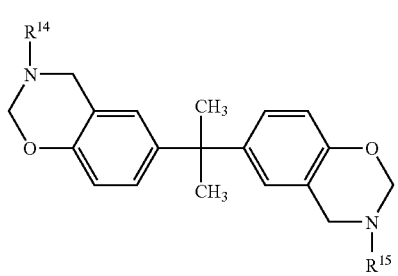

XIII

-continued
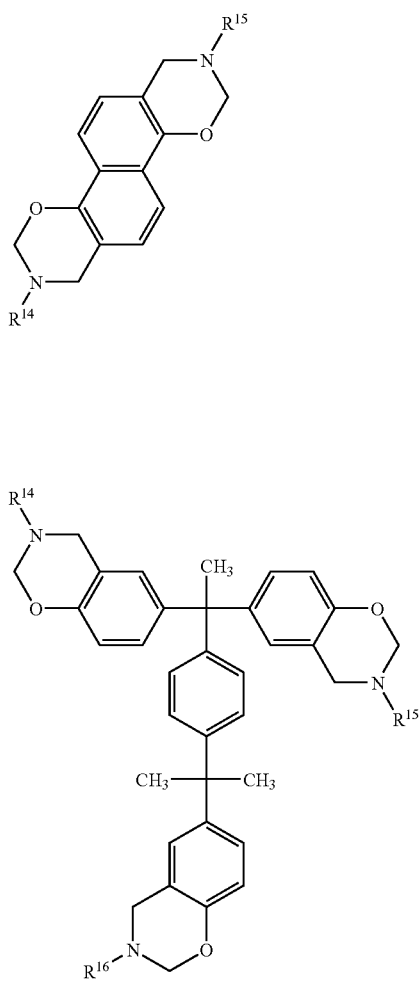
XIV
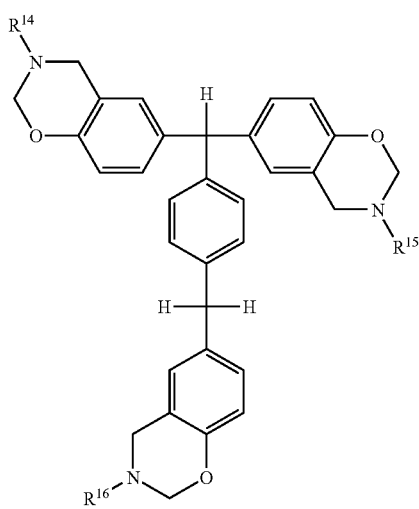
where R[14], R[15] and R[16] are the same or different and are selected from methyl, ethyl, propyls, butyls or aryl.
For instance, specific multifunctional benzoxazines include
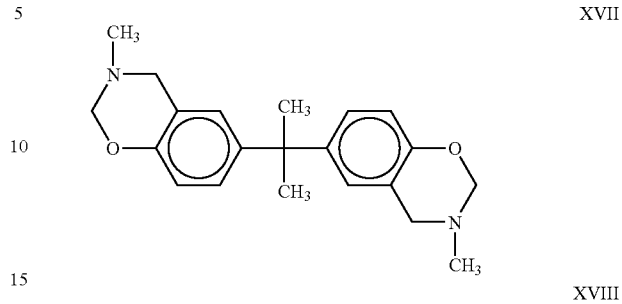
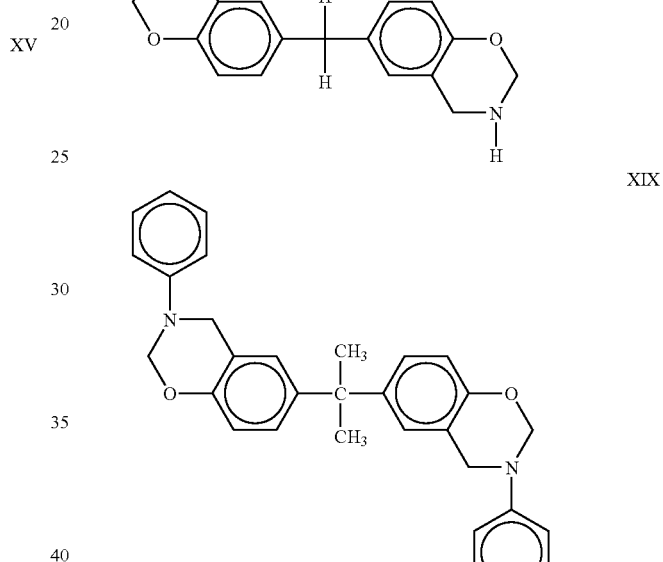
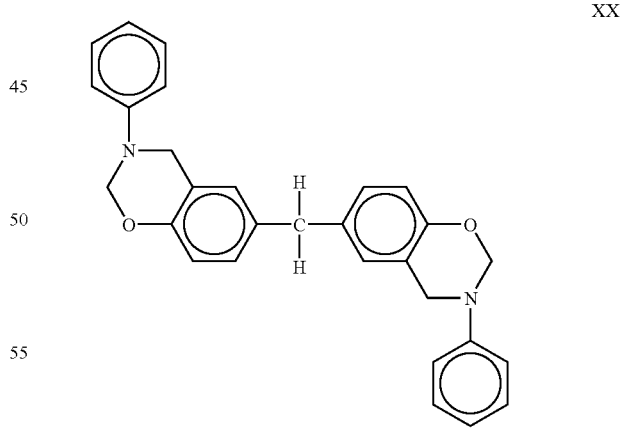

-continued

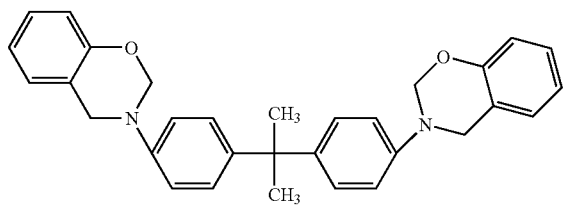

XXII

Thus, the benzoxazine component may include multifunctional benzoxazines, monofunctional benzoxazines, and combinations thereof.

The monofunctional benzoxazine comprises

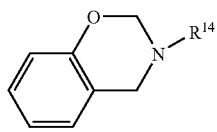

XXIII where $R^{14}$ is selected from methyl ethyl, propyls, butyls or aryl, such as methyl.

When a diluent is added, it is desirable for the diluent to be a reactive diluent which, in combination with the maleimide-, nadimide-, and itaconimide-containing compound or benzoxazine-containing compound, forms a thermosetting resin composition. Such reactive diluents include acrylates and methacrylates of monofunctional and polyfunctional alcohols, vinyl compounds as described in greater detail herein, styrenic monomers (i.e., ethers derived from the reaction of vinyl benzyl chlorides with mono-, di-, or trifunctional hydroxy compounds), and the like.

An especially preferred class of reactive diluents corresponding to vinyl or polyvinyl compounds comprise the general formula:

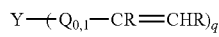

XXIV where q is 1, 2 or 3, each R is independently selected from hydrogen or lower alkyl, each Q is independently selected from ether, ketone, ester or reverse ester, and Y is a monovalent moiety or a multivalent linking moiety.

The multivalent linking Y is typically selected from J above.

Exemplary vinyl or polyvinyl compounds embraced by the above generic structure include stearyl vinyl ether, behenyl vinyl ether, eicosyl vinyl ether, isoeicosyl vinyl ether, isotetracosyl vinyl ether, poly(tetrahydrofuran) divinyl ether, tetraethylene glycol divinyl ether, tris-2,4,6-(1-vinyloxybutane-4-oxy-1,3,5-triazine, bis-1,3-(1-vinyloxybutane-4-)-oxycarbonyl-benzene (alternately referred to as bis(4-vinyloxybutyl)isophthalate; available from Honeywell International Inc., Morristown, N.J., under the trade name "VECTOMER" 4010), divinyl ethers prepared by transvinylation between lower vinyl ethers and higher molecular weight di-alcohols, in the presence of a suitable palladium catalyst, optionally hydrogenated disubstituted polybutadienes, optionally hydrogenated disubstituted polyisoprenes, optionally hydrogenated disubstituted poly[(1-ethyl)-1,2-ethane], and the like. Preferred divinyl resins include stearyl vinyl ether, behenyl vinyl ether, eicosyl vinyl ether, isoeicosyl vinyl ether, poly(tetrahydrofuran) divinyl ether, divinyl ethers prepared by transvinylation between lower vinyl ethers and higher molecular weight di-alcohols, in the presence of a suitable palladium catalyst, and the like.

Additionally, divinyl compounds corresponding to structure XXIV where -Q- is an ester and Y is a high molecular weight branched chain alkylene species having from about 12 to about 500 carbon atoms are useful thermosetting resin compositions, even in the absence of bismaleimide resins. When combined with suitable amounts of at least one free radical initiator and at least one coupling agent, these divinyl ether resins, alone, are capable of forming thermosetting resin compositions exhibiting excellent physical properties, including rapid cure rates and low water absorption.

Of course, the die attach material may include combinations of a vinyl compound of structure XXIV and a maleimide-, nadimide-, or itaconimide-containing compound or benzoxazine-containing compound, so as to benefit from the highly desirable combination of physical properties, including both rapid cure rates and low water absorption.

Desirably, the pre-applied die attach adhesive material may further include a thermoplastic elastomer which is co-curable therewith, particularly when the maleimides, itaconamides and nadimides are in the liquid form. As employed herein, "co-curable" refers to the ability of a thermoplastic elastomer to undergo copolymerization with a macromonomer such as the maleimide, itaconamide and nadimide containing compound to form a three-dimensional polymeric network.

Thermoplastic elastomers contemplated for use in the practice of the present invention are typically block copolymers. The block copolymers having at least one unit of the general formula (A-B) or (A-B-A), wherein A is a non-elastomeric polymer block and B is an elastomeric polymer block. Block copolymers contemplated for use in the practice of the present invention preferably have low dielectric constants. In addition, the thermoplastic include pendant and/or terminal units of ethylenic unsaturation, and therefore are able to cure with other components in the die attach material.

The non-elastomeric polymer block (A) may be the polymerization product of one or more optionally substituted aromatic hydrocarbons containing at least one unit of ethylenic unsaturation. Aromatic hydrocarbons contemplated for use in the practice of the present invention include, for example, optionally substituted styrene, optionally substituted stilbene, and the like. Substituents contemplated for optional use in the practice of the present invention include for example, alkyl, alkenyl, alkynyl, hydroxy, alkoxy, alkenoxy, and the like. In a preferred embodiment, the aromatic hydrocarbon is optionally substituted styrene.

The elastomeric polymer block (B) is typically the polymerization or copolymerization product of optionally substituted olefin monomers and/or optionally substituted conjugated diene monomers. Olefin monomers contemplated for use in the practice of the present invention typically contain from 2 up to about 20 carbon atoms. Preferably, the olefin monomers contain from 2 up to about 12 carbon atoms. In a particularly preferred embodiment, the olefin monomers include, for example, ethylene, propylene, butylene, isobutylene, acrylonitrile, (meth)acrylate, and the like. Most preferably, the olefin monomer is acrylonitrile.

Conjugated diene monomers contemplated for use in the practice of the present invention typically contain from 4 up to about 20 carbon atoms. Preferably, the conjugated diene monomers contain from 4 up to about 12 carbon atoms. In a particularly preferred embodiment, the conjugated diene monomers include, for example, butadiene, isoprene, dimethylbutadiene, and the like. Most preferably, the conjugated diene monomer is butadiene.

Thermoplastic elastomers contemplated for use include, for example, polystyrene-polybutadiene-polystyrene block copolymers, polystyrene-polyisoprene-polystyrene block copolymers, polystyrene-polydimethylbutadiene-polystyrene block copolymers, polybutadiene-polyacrylonitrile block copolymers, and the like. Preferably, the block copolymer is a polystyrene-polybutadiene-polystyrene block copolymer or a polybutadiene-polyacrylonitrile block copolymer.

When a thermoplastic elastomer is employed, the die attach material typically contains in the range of about 10 wt % up to about 95 wt % thermoplastic elastomer, in the range of about 5 wt % up to about 90 wt % of the maleimide-, itaconamide- or nadimide-containing compound, or the benzoxazine-containing compound, and in the range of about 0.2 wt % up to about 2.0 wt % a cure initiator, where wt % is based on the total weight of the composition. Preferably, the maleimide-, itaconamide- or nadimide-containing compound, or the benzoxazine-containing compound, is present from about 10 wt % to about 80 wt %.

A cure initiator may also be included, and when included desirably is a free radical initiator, triggered either by exposure to temperatures in the range of about 70° C. to about 180° C., or to radiation in the electromagnetic spectrum. As employed herein, the term "free radical initiator" refers to any chemical species which, upon exposure to sufficient energy (e.g., light, heat, or the like), decomposes into at least two species which are uncharged, but which each possesses at least one unpaired electron.

Thermal free-radical cure initiators include for example, peroxides (e.g., peroxy esters, peroxy carbonates, hydroperoxides, alkylperoxides, arylperoxides, and the like), azo compounds, and the like. Presently preferred peroxides contemplated for use in the practice of the present invention include dicumyl peroxide, dibenzoyl peroxide, 2-butanone peroxide, tert-butyl perbenzoate, di-tert-butyl peroxide, 2,5-bis(tert-butylperoxy)-2,5-dimethylhexane, bis(tert-butyl peroxyisopropyl)benzene, tert-butyl hydroperoxide, and the like. Presently preferred azo compounds contemplated for use in the practice of the present invention include 2,2'-azobis(2-methylpropanenitrile), 2,2'-azobis(2-methylbutanenitrile), 1,1'-azobis (cyclohexanecarbonitrile), and the like.

Radiation free-radical cure initiators (or, photoinitiators) include for example, those commercially available from Vantico, Inc., Brewster, New York under the tradename "IRGACURE" and "DAROCUR", such as "IRGACURE" 184 (1-hydroxycyclohexyl phenyl ketone), 907 (2-methyl-1-[4-(methylthio)phenyl]-2-morpholino propan-1-one), 369 [2-benzyl-2-N,N-dimethylamino-1-(4-morpholinophenyl)-1-butanone], 500 (the combination of 1-hydroxy cyclohexyl phenyl ketone and benzophenone), 651 (2,2-dimethoxy-2-phenyl acetophenone), 1700 [the combination of bis(2,6-dimethoxybenzoyl-2,4,4-trimethyl pentyl)phosphine oxide and 2-hydroxy-2-methyl-1-phenyl-propan-1-one] and "DAROCUR" 1173 (2-hydroxy-2-methyl-1-phenyl-1-propane) and 4265 (the combination of 2,4,6-trimethylbenzoyl-diphenyl-phosphine oxide and 2-hydroxy 2-methyl-1-phenyl-propan-1-one); photoinitiators available commercially from Dow Chemical under the "CYRACURE" tradename, such as "CYRACURE" UVI-6974 (mixed triaryl sulfonium hexafluoroantimonate salts) and UVI-6990 (mixed triaryl sulfonium hexafluorophosphate salts); and the visible light [blue] photoinitiators, dl-camphorquinone and "IRGACURE" 784DC.

Additional photoinitiators may be chosen from those available from Sartomer, Inc., Exton, Pa. under the tradenames "ESACURE" and "SARCAT". Examples include "ESACURE" KB1 (benzil dimethyl ketal), "ESACURE" EB3 (mixture of benzoin and butyl ethers), "ESACURE" TZT (trimethylbenzophenone blend), "ESACURE" KIP100F (hydroxy ketone), "ESACURE" KIP150 (polymeric hydroxy ketone), "ESACURE" KT37 (blend of: "ESACURE" TZT and KIP150), "ESACURE" KT046 (blend of triphenyl phosphine oxide, "ESACURE" KIP150 and TZT), "ESACURE" X33 (blend of 2- and 4-isopropylthioxanthone, ethyl 4-(dimethyl amino)benzoate and "ESACURE" TZT], "SARCAT" CD 1010 [triaryl sulfonium hexafluoroantimonate (50% in propylene carbonate)], "SARCAT" DC 1011 [triaryl sulfonium hexafluorophosphate (50% n-propylene carbonate)], "SARCAT" DC 1012 (diaryl iodonium hexafluoroantimonate), and "SARCAT" K185 [triaryl sulfonium hexafluorophosphate (50% in propylene carbonate)].

Photoinitiators include triarylsulfonium and diaryliodonium salts containing non-nucleophilic counterions and aryl diazonium salts, examples of which include 4-methoxybenzenediazonium hexafluorophosphate, benzenediazonium tetrafluoroborate, diphenyl iodonium chloride, diphenyl iodonium hexafluorophosphate, 4,4-dioctyloxydiphenyl iodonium hexafluorophosphate, triphenylsulfonium tetrafluoroborate, diphenyltolylsulfonium hexafluorophosphate, phenylditolylsulfonium hexafluoroarsenate, and diphenyl-thiophenoxyphenylsulfonium hexafluoroantimonate.

Of course, combinations of such photoinitiators may be used as deemed appropriate by those of ordinary skill in the art.

As employed herein, the term "coupling agent" refers to chemical species which contain one set of functional groups capable of bonding to mineral and/or organic surfaces and which 2-5, also contain another set of reactive functional groups capable of bonding to the reactive materials in the die attach adhesive material. Coupling agents thus facilitate linkage of the die attach material to the substrate to which it is applied.

Exemplary coupling agents contemplated for use in the practice of the present invention include silicate esters, metal acrylate salts (e.g., aluminum methacrylate), titanates (e.g., titanium methacryloxyethylacetoacetate triisopropoxide), or compounds that contain a copolymerizable group and a chelating ligand (e.g., phosphine, mercaptan, acetoacetate, and the like). Generally in the range of about 0.1 up to 10 wt % of at least one coupling agent (based on the total weight of the organic phase) will be employed, with the range of about 0.5 up to 2 wt % being desirable.

Certain desirable coupling agents contain both a co-polymerizable function (e.g., vinyl moiety, acrylate moiety, methacrylate moiety, styrene moiety, cyclopentadiene moiety, and the like), as well as a silicate ester function. The silicate ester portion of the coupling agent is capable of condensing with metal hydroxides present on the mineral surface of the substrate, while the co-polymerizable function is capable of co-polymerizing with the other reactive components of invention adhesive composition. An example of such a coupling agent is an oligomeric silicate coupling agent, such as poly(methoxyvinylsiloxane).

The pre-applied die attach adhesive material may further include in the range of about 20 up to 90 wt % filler, based on the total weight of the pre-applied die attach composition.

Fillers contemplated for use in the practice of the present invention may optionally be conductive (electrically and/or thermally). Electrically conductive fillers contemplated for use in the practice of the present invention include, for example, silver, nickel, gold, cobalt, copper, aluminum, graphite, silver-coated graphite, nickel-coated graphite, alloys of such metals, and the like, as well as mixtures thereof. Both powder and flake forms of filler may be used herein. In flake form, the filler may have a thickness of less than about 2 microns, with planar dimensions of about 20 to about 25 microns. Flake employed herein may have a surface area of about 0.15 to 5.0 $m^2/g$ and a tap density of about 0.4 up to about 5.5 g/cc. In powder form, the filler particles may have a diameter of about 0.5 to 30 microns, such as about 20 microns.

When present, the filler typically is used from about 1 wt % to about 95 wt % of the pre-applied die attach material, where wt % is based on the total weight of the composition.

Thermally conductive fillers contemplated for use herein include, for example, aluminum nitride, boron nitride, silicon carbide, diamond, graphite, beryllium oxide, magnesia, silica, alumina, and the like.

Electrically and/or thermally conductive fillers should be rendered substantially free of catalytically active metal ions by treatment with chelating agents, reducing agents, nonionic lubricating agents, or mixtures of such agents. Such treatment is described in U.S. Pat. No. 5,447,988, which is expressly incorporated by reference herein in its entirety.

Optionally, a filler may be used that is neither electrically nor thermally conductive. Such fillers may be desirable to impart some other property to the formulation such as, for example, reduced thermal expansion of the cured composition, reduced dielectric constant, improved toughness, increased hydrophobicity, and the like. Examples of such fillers include perfluorinated hydrocarbon polymers (i.e., TEFLON), thermoplastic polymers, thermoplastic elastomers, mica, fused silica, glass powder, spacer elements and the like.

The pre-applied die attach adhesive material may further contain other additives, such as defoaming agents, leveling agents, dyes, and pigments.

Figure 3:
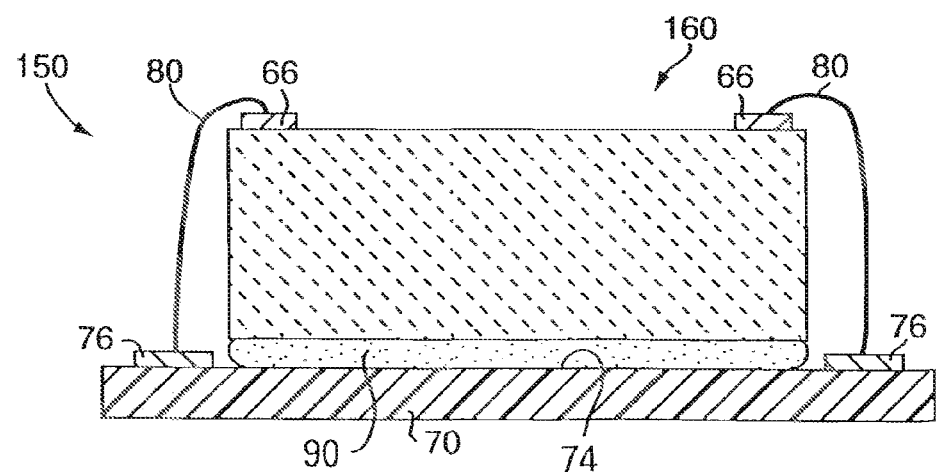
FIG. 3 is a schematic representation of a circuit assembly including a semiconductor chip assembled to a chip scale package in a further embodiment of the present invention.
Figure 4:
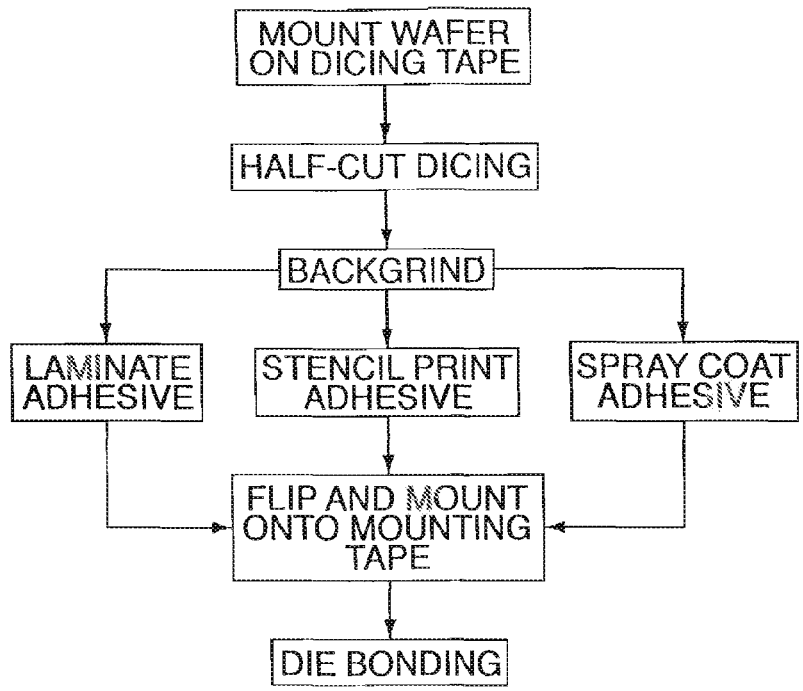
FIG. 4 is a schematic representation of a wafer backside application.
Figure 5:
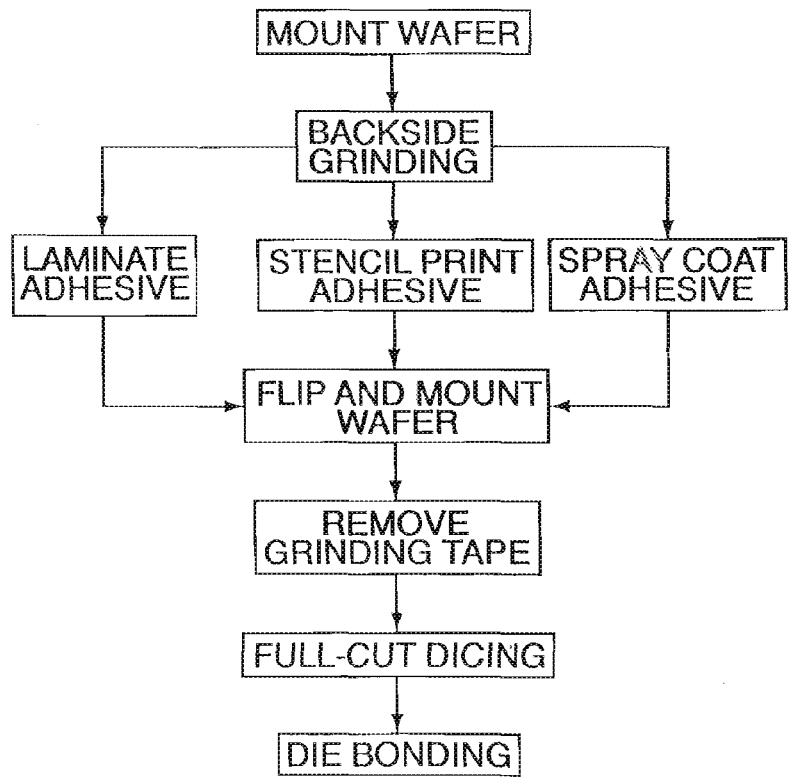
FIG. 5 is a schematic representation of a wafer backside application.
Figure 6:
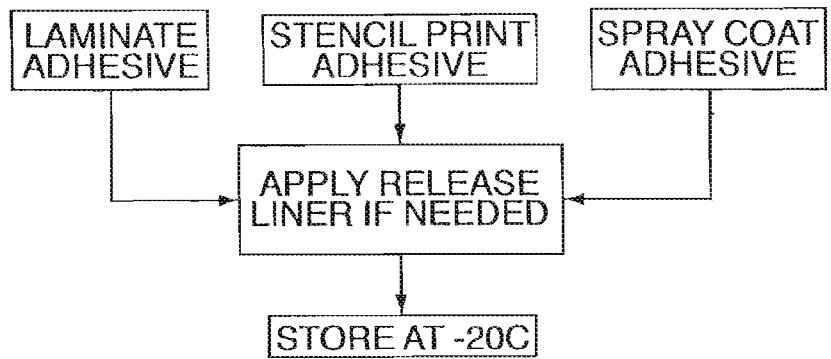
FIG. 6 is a schematic representation of a substrate application.

The die attach adhesive material may be applied to the semiconductor chip (see e.g. FIGS. 1-3) by stencil printing, screen printing or spray coating to form the pre-applied die attach circuit chip. See FIGS. 4-6, respectively. In addition, the die attach adhesive material may be applied to a substrate other than the semiconductor chip (see FIG. 9) by stencil printing, screen printing or spray coating to form the pre-applied die attach circuit chip. And the die attach adhesive material may be applied to an intermediate substrate, such as a wafer dicing tape or film, a wafer supporting tape or film, which is used to transport the die attached adhesive material pre-applied on the tape or film for transfer onto the semiconductor chip or other substrate.

In the case of stencil printing or screen printing onto pre-diced wafers, the wafers can be uniformly coated with the die attach adhesive material. During wafer dicing, the dicing saw then cuts completely through the pre-applied die attach adhesive material layer and the wafer.

In the case of stencil printing or screen printing onto pre-diced wafers, the stencil or screen is made with apertures designed to partially, not completely, coat the individual die or semiconductor chips. Specifically, the webbing of the stencil or screen is used to maintain the die attach adhesive material in place. That is, it is undesirable for the die attach adhesive material to enter into the dicing streets, which would facilitate die separation during die placement. The width of the webbing, or conversely, the dimensions of the aperture, are designed so that after die placement, the target wet bondline may be achieved and the die attach adhesive material may form fillets of the desired height beneath the die.

In the case of stencil printing or screen printing onto laminate substrates, the stencil or screen is made with apertures designed to partially coat the die pad. Specifically, the webbing of the screen or stencil is used to maintain in place the die attach adhesive material after die placement. The width of the webbing, or conversely, the dimensions of the aperture, are designed so that after die placement, the target wet bondline may be achieved and the pre-applied die attach adhesive material may form fillets of the desired height beneath the die with minimal to no wetting by the pre-applied die attach adhesive material of the electrically conductive interconnects.

In the case of application onto laminate substrates, a "zero gap bondline" may be achieved with the die attach adhesive material. For instance, the laminate is first manufactured without a solder mask layer over the die pad. Thus, the die pad area is lower in height relative to the non-die pad areas by a depth equal to the thickness of the solder mask layer, which is typically around 1 mil. These recessed die pads are then filled with the die attach adhesive material, using stencil printing or screen printing.

Preferably, an amount of die attach adhesive material is applied until the surface of the applied adhesive material is flush with the solder mask layer. The recessed die pad is not completely filled in with the die attach adhesive material; rather, an amount of the die attach adhesive material is used such that after die placement, the die attach adhesive material has flowed underneath the die to cover the previously exposed die pad bottom. This method allows for semiconductor packaging manufacturers to achieve thinner packages without changing the bondline adhesive.

Where the die attach adhesive material is pre-applied on a substrate other than a semiconductor chip, the substrate may be a laminate (as noted above), a ceramic, a lead frame, a heat slug or heat spreader (as noted above), or an intermediate substrate (as also noted above).

Figure 9:
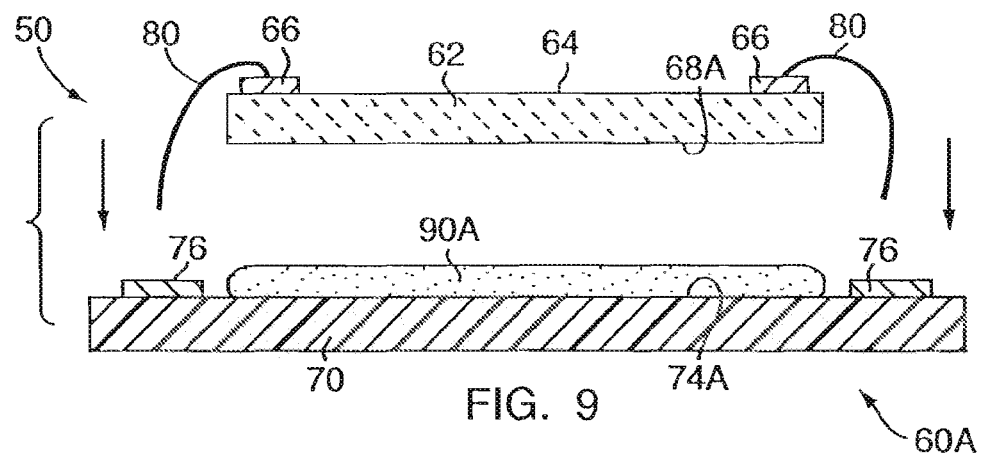
FIG. 9 is a schematic representation of a pre-applied die attach carrier substrate in one embodiment of the present invention prior to assembly with a semiconductor chip.

Referring to FIG. 9, a die attach adhesive material 90A is pre-applied onto a carrier substrate 70 to form a pre-applied die attach carrier substrate 60A. When the bonding surface 68A of a semiconductor chip 62 is brought into contact with the pre-applied die attach carrier substrate 60A and electrical connections established, such as by way of bonding wires 80 to electrical contact pads 76 on the carrier substrate 70 from electrical contact pads 66 on the semiconductor chip 62, a circuit assembly 50 is formed.

In the case of spray coating, thin semiconductor wafers are desirable substrates on which to coat the die attach adhesive material. These thin semiconductor wafers have thickness of about 2-3 mil. Although mechanically robust once properly supported, i.e., bonded onto flexible substrates and encapsulated or overmolded, in their unsupported form thin dice derived from these wafers are fragile and break rather easily. It is therefore advantageous that a method for applying die attach adhesive material onto thin wafers apply minimal force while doing so.

After the die attach adhesive material has been applied onto the wafer or die using any of the above methods, the adhesive material may then be dried to remove solvent, if present, or cooled to solidify the adhesive material.

A typical drying time may be about 30 minutes at a temperature of about 100° C., though any temperature below the cure onset of the curable components of the die attach adhesive material may be chosen. The length of time may vary depending on the time required for the surface of the die attach adhesive material to become tack free at the chosen temperature.

Any time after the surface of the die attach adhesive material is tack free (either by drying or cooling, or B-staging, as noted above), die bonding may occur.

Conditions suitable for curing the pre-applied die attach adhesive material, particularly one containing maleimide-, nadimide-, and itaconimide-containing compound include subjecting the pre-applied die attach adhesive material to a temperature of at least about 175° C. but less than about 300° C. for about 0.5 up to about 2 minutes. A typical die bonding setting is a time of about 10 seconds at a temperature of about 100° C. using 500 cN spread, in the case of a 7.6 mm×7.6 mm die. This rapid, short duration heating can be accomplished in a variety of ways, e.g., with in-line snap cure stations such as those manufactured by Nihon Sanso, a heated stage mounted on the diebonder, or an IR beam provided by an EFOS Novacure IR unit. For a pre-applied die attach adhesive material containing a benzoxazine compound, the same temperature conditions may be used to cure the adhesive material, though ordinarily a longer time may be desirable, such as about 1 hour.

In the case of a stacked die assembly (such as described in U.S. Pat. Nos. 5,140,404, 5,286,679, 5,323,060, and 6,465, 893, the disclosures of each of which being hereby expressly incorporated herein by reference), it is advantageous to heat the die before die placement in order to melt the die attach adhesive material, particularly where a co-curable thermoplastic component is present, to allow for improved wetting of the substrate on which it is about to be placed. The die can be heated by pulsing heat through the die collet, which is an available feature in film diebonders, such as those manufactured by ESC. In the case of thin die which are typically warped due to the build-up of residual mechanical stress during the grinding process, heating the die above a certain temperature has the effect of annealing the die and reducing warpage.

Figure 8:
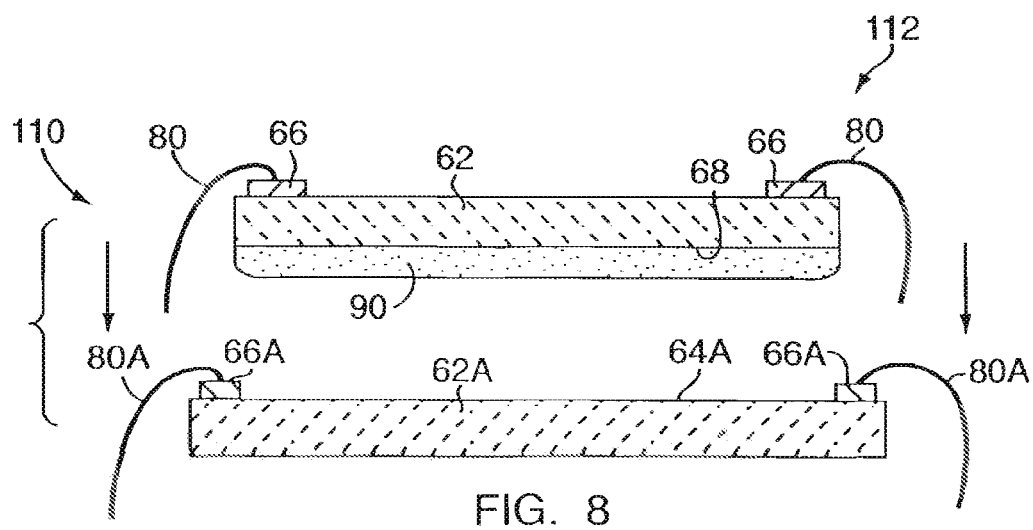
FIG. 8 is a schematic representation of a stacked die application, where the upper semiconductor chip is pre-applied with die attach adhesive material.
Figure 10:
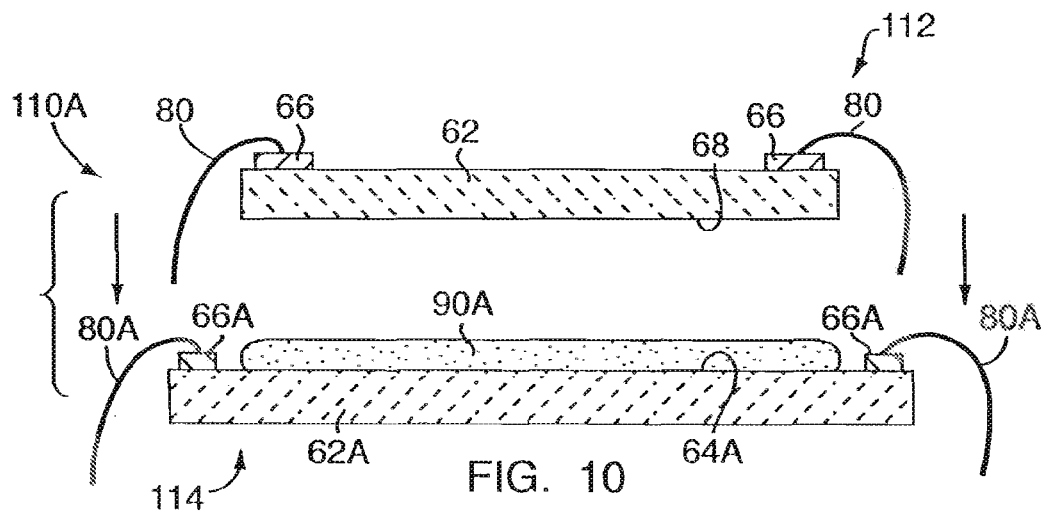
FIG. 10 is a schematic representation of a stacked die application, where the lower semiconductor chip is pre-applied with die attach adhesive material.

FIGS. 8 and 10 depict a cross sectional view of two dies to be stacked in a stacked die assembly 110. The difference in this two configuration is that in FIG. 8 the die attach adhesive material 90 is pre-applied on the lower surface 68 of the upper semiconductor chip 112 in the stacked die assembly 110, whereas in FIG. 10 the die attach adhesive material 90A is pre-applied on the upper surface 68 of the lower semiconductor chip 114 of the in the stacked die assembly 110A. Referring to FIG. 8, the stacked die assembly 110 includes a semiconductor chip in the form of pre-applied die attach circuit chip 112 (having chip die 62 and pre-applied die attach adhesive 90 disposed thereon), and another chip die 62A, to which pre-applied die attach circuit chip 110 will be attached on handing surface 64A of chip die 62A. Pre-applied die attach circuit chip 112 has bond pads 66 and bonding wires 80, to which become electrically connected to chip die 62A by way of bonding pads 66A on chip die 62A. Bonding wires BOA extend from bond pads 66A, to either another chip die (not shown) or a circuit board (not shown) for electrical interconnection.

It is noted that chip die 62 as discussed herein may be provided as an individual chip die, or may be provided as a chip scale package. Accordingly, in yet a further embodiment shown in FIG. 3, a circuit assembly 150 is provided including a chip scale package 160. Chip scale packages are known in the art for use in electrical connections of circuits with circuit board substrates. In the present embodiment, circuit assembly 150 includes a structure similar to that shown in the embodiment depicted in FIG. 2, except that chip die 62 is replaced with chip scale package 160. For example, circuit assembly 150 includes a circuit board substrate 70 including contact pads 76 thereon. Substrate 70 is attached to chip scale package 160, which may include, for example, a chip die attached to a separate carrier substrate or an interposer layer, as is known in the art. In such an embodiment, contact pads 66 and/or wires 80 may be provided on such a separate carrier substrate or on the interposer layer, in a similar manner as set forth with respect to circuit chip 60 in the previous description. Moreover, chip scale package 160 is attached to substrate 70 in a similar manner as with the previous description, through die attach material 90.

The invention also provides a method for adhesively attaching the inventive article of manufacture to a carrier substrate, such as a chip die or a circuit board. The method includes:

a. providing the inventive article of manufacture;
b. providing a carrier substrate;
c. adjoining the inventive article of manufacture with the carrier substrate to form an assembly where the inventive article of manufacture and the carrier substrate are separated by the pre-applied die attach adhesive material; and
d. exposing the so-formed assembly to a temperature condition sufficient to cure the pre-applied die attach adhesive material.

In another aspect of the invention, maleimides, itaconamides and nadimides possess a physical property profile which make them suitable for use as an ILD used in the manufacture of silicon die. Oftentimes, in their liquid form, these maleimides, itaconamides and nadimides have a sufficiently low viscosity which enable spin coating. In addition, their viscosity can be reduced further, if desired by heating or combining with a reactive diluent as discussed above, for spin coating thinner ILD's. Likewise, in the solid form, such maleimides, itaconamides and nadimides may be warmed or combined with dilueant to allow for spin coating. These maleimides, itaconamides and nadimides have a high thermal degradation temperature and high homopolymerization onset which allows thinning by heating. Because the maleimides, itaconamides and nadimides are curable by exposure to radiation in the electromagnetic spectrum, such as UV, photolithography to some resolution may be achieved. The cured products of the maleimides, itaconamides and nadimides have a sharp thermal degradation point, which allows for clean and sharp laser ablation.

Figure 7:
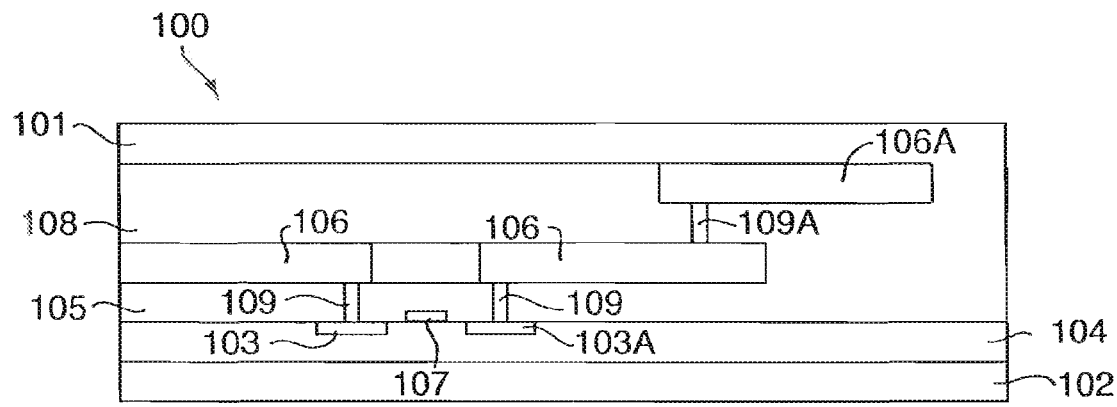
FIG. 7 is a schematic representation of a semiconductor chip with an interlayer dielectric material.

FIG. 7 shows in cross-section a semiconductor chip 100, in which a layer of ILD 108 is shown between a first and a second conductor 106A. More specifically, the semiconductor chip 100 is formed from a silicon substrate 102, which has been exposed to elevated temperature conditions in an oxidizing atmosphere such that a layer 104 of silicon oxide forms as a semiconductor layer 104 thereover. The semiconductor layer 104 shows a source of electrons 103, as well as a drain for electrons 103A, together with a gate 107, which controls the flow of electrons by regulating voltage. The layer 105 disposed over the semiconductor layer is made in this figure from borophosphosilicate glass, which may be applied by a chemical vapor deposition process. Since the semiconductor layer 104 is formed with an irregular surface, this borophosphorosilicate glass surface planes those irregularities. The next layer shown is a first conductive layer 106, here shown as being constructed from copper. This conductor layer 106 may have a dissipation barrier coated thereover (not shown). On top of the first conductive layer 106 is a layer of ILD, on top of which is a second conductive layer 106A. Finally In FIG. 7 is shown a passivation layer 101. The passivation layer 101 is often spin coated. Between the second conductive layer 106A and a first conductive layer 106 is a via 109A, which has been formed through the layer of ILD 108 such that electrons can flow. And, between the first conductive layer 106 and the semiconductor layer 106A is another via 109 for the same purpose.

Thus, broadly speaking the invention in this aspect provides a semiconductor chip, which includes a silicon substrate, semiconductor layer, at least two conductor layers, between two of which is an interlayer dielectric comprising one or more maleimide-, itaconamide- or nadimide-containing compound(s), or one or more benzoxazine-containing compounds).

The invention will now be described in greater detail by reference to the following non-limiting examples.

EXAMPLES

In a first example, a die attach adhesive material was prepared for pre-application to a semiconductor chip using the styrene-butadiene block copolymer, KRATON D-1102, as a thermoplastic elastomeric component, and octadecylmaleimide and X-BMI (the 1,20-bismaleimido derivative of 10,11-dioctyl-eicosane, as maleimides. The die attached adhesive material for pre-application was prepared from the components recited below in Table 1.

TABLE 1

| | |
|---|---|
| Octadecylmaleimide | 1.0 g |
| KRATON D-1102 | 2.5 g |
| X-BMI[1] | 1.5 g |
| RICON 130[2] | 0.2 g |
| Silane coupling agent[3] | 0.2 g |
| Dicumyl peroxide | 0.05 g |
| Xylene | 5.0 g |
| TEFLON filler | 6.9 g |

[1]X-BMI (the 1,20-bismaleimido derivative of 10,11-dioctyl-eicosane), was prepared according to the procedure set forth in U.S. Pat. No. 5,973,166, the disclosure of which is hereby expressly incorporated herein by reference.
[2]Polybutadiene 20% grafted with maleic anhydride (Sartomer)
[3]Proprietary silane-containing coupling agent.

Octadecylmaleimide was dissolved in xylene, and KRATON D-1102 was added and allowed to dissolve before the remaining components were added.

A film was cast onto a glass substrate and dried overnight. A silicon die was then placed onto the film, and the film-coated substrate was heated to a temperature of 80° C. for 1 to 3 seconds. This assembly was finally cured at a temperature of 80° C. for 30 minutes.

The film die attach composition was evaluated for room temperature die shear and hot die shear on a calibrated Dage 2400 die shear tester. The results are shown below in Table 2, compared to QMI536, a die attach product, commercially available from Henkel Loctite Corporation, LaJolla, Calif., which includes the same combination of bismaleimides as employed above. Also included in Table 2 are die shear values after the cured composition was subjected to conditions of 85° C./85% humidity for a period of time of 24 hrs.

TABLE 2

| Formulations | Room Temperature Die Shear (lbs) | Hot Die Shear (245° C.) (lbs) |
|---|---|---|
| QMI536, initial | 59.1 | 24.4 |
| Formulation 1, initial | 88.9 | 25.9 |
| QMI536, 24 hrs. 85/85 | 52.6 | 23.9 |
| Formulation 1, 24 hrs. 85/85 | 79.6 | 24.6 |

The results shown above demonstrate that Formulation 1 has superior die shear strength compared to an analogous flowable die attach composition, not in a pre-applied, non-flowable form.

In a second example, two samples were prepared using a benzoxazine-containing compound for the die attach material. The constituents of each of Formulations 2 and 3 are set forth below in Table 3 by parts.

TABLE 2

| | | |
|---|---|---|
| Benzoxazine[4] | 2 | 1.5 |
| RICON 130[2] | 0.2 | 0.2 |
| Silane coupling agent[3] | 0.1 | 0.1 |
| Resin[5] | 0.5 | 0.5 |
| Epoxy[6] | — | 0.5 |
| Acetone | 2 | 2 |
| TEFLON filler | 2 | 2.2 |

[4]believed to have been made from bisphenol F, thiodiphenol, aniline and formaldehyde, and is available from Vantico under trade designation XU 3560 US.
[5]Proprietary hydroxy functionalized aromatic resin.
[6]ARALDITE 7097US.

Formulations 2 and 3 were prepared as follows. The benzoxazine was dissolved in acetone at room temperature, together with the epoxy (for Formulation 3). To this was added with mixing at room temperature the resin, the RICON 130 and the silane coupling agent. Finally, the TEFLON filler was added and thoroughly mixed to form a smooth, creamy paste.

Like Formulation 1, Formulations 2 and 3 were cast film onto glass slides. The glass slides coated with Formulations 2 and 3 were exposed to a temperature in the range of 95 to 125° C. for a period of time of about 10 to 60 minutes, and allowed to cool to room temperature. Once at room temperature, a semiconductor chip was placed over each formulation-coated glass slide, and the chip and substrate were together under a temperature of 95 to 125° C. to attach the chip to the substrate. The formulations were then cured at a temperature of 175° C. for a period of time of 1 hour.

Once cured, Formulations 2 and 3 were evaluated for shear strength. Thus, 300 mil die on glass attached by Formulation 2 exhibited 62.8 Kg-f at room temperature, and 3.3 Kg-f at a temperature of 245° C., and those attached by Formulation 3 exhibited 56.4 Kg-f at room temperature, and 2.7 Kg-f at a temperature of 245° C.

Formulations 2 and 3 were also subject to differential scanning calorimetery in order to determine their onset temperatures, cure peaks and a cured energy. Formulations 2 was observed to have an onset temperature of 190° C., whereas Formulation 3 was observed to have an onset temperature of 195° C. Formulation 2 demonstrated a cure peak of 214° C., whereas Formulation 3 demonstrated a cured peak of 222° C. Formulation 2 also demonstrated a cure energy of 171.75 J/g, whereas Formulation 3 showed a cure energy of 91.7 J/g.

What is claimed is:

1. A semiconductor chip comprising:
a silicon substrate;
a semiconductor layer;

at least two conductor layers, between at least two of which is an interlayer dielectric comprising one or more maleimide-, itaconamide- or nadimide-containing compound(s).

2. The semiconductor chip according to claim 1, wherein the maleimide-, nadimide- or itaconimide-compound(s) comprise(s)

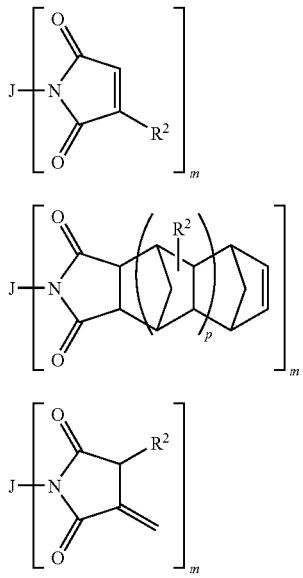

respectively, wherein:
m=1-15,
p=0-15,
each $R^2$ is independently selected from hydrogen or lower alkyl, and J comprises a monovalent or a polyvalent moiety comprising organic or organosiloxane radicals, and combinations of two or more thereof.

3. The semiconductor chip according to claim 1, wherein J comprises a branched chain alkyl, alkylene, alkylene oxide, alkylene carboxyl or alkylene amido species having sufficient length and branching to render the maleimide, nadimide and/or itaconimide compound a liquid, and m is 1, 2 or 3.

4. The semiconductor chip according to claim 1, wherein the maleimide-containing compound, the nadimide-containing compound or the itaconimide-containing compound comprises structures I, II or III, respectively, wherein
m=1-6,
p=0,
$R^2$ is independently selected from hydrogen or lower alkyl, and
J is a monovalent or polyvalent radical selected from hydrocarbyl, substituted hydrocarbyl, heteroatom-containing hydrocarbyl, substituted heteroatom-containing hydrocarbyl, hydrocarbylene, substituted hydrocarbylene, heteroatom-containing hydrocarbylene, substituted heteroatom-containing hydrocarbylene, polysiloxane, polysiloxane-polyurethane block copolymer, and combinations of two or more thereof, optionally containing one or more linkers selected from the group consisting of a covalent bond —O—, —S—, —NR—, —O—C(O)—, —O—C(O)—O—, —O—C(O)—NR—, —NR—C(O)—, —NR—C(O)—O—, —NR—C(O)—NR—, —S—C(O)—, —S—C(O)—O—, —S—C(O)—NR—, —S(O)—, —S(O)$_2$—, —(O)—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$—, —S—P(O)R$_2$—, —NR—P(O)R$_2$—, wherein each R is independently hydrogen, alkyl or substituted alkyl, and combinations of any two or more thereof.

5. A semiconductor chip comprising:
a silicon substrate;
a semiconductor layer;
at least two conductor layers, between at least two of which is an interlayer dielectric comprising one or more benzoxazine-containing compound(s).

6. The semiconductor chip according to claim 5, wherein the benzoxazine component comprises

wherein:
L is a member selected from the group consisting of an alkylene or a siloxane linking moiety, hydrogen, a direct bond, O, C=O, S, O=S=O, C, CH, CH$_2$, and CR$^9$R$^{10}$, wherein R$^9$ and R$^{10}$ are alkyl, halogen substituted alkyl, aryl or alkaryl;
Ar is optionally substituted arylene;
Q is an oxazine ring or amine salt thereof having the structure:

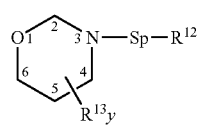

and is bonded to Ar in a fused manner at positions 5 and 6 of the oxazine ring,
wherein:
Sp is optional, and if present, is a C$_1$ to C$_6$ alkylene spacer,
n is 1 or 2,
m is 1 to 4,
x and y are each independently 0 to 4, and
at least one of R$^{11}$, R$^{12}$, or R$^{13}$ is a polymerizable moiety.

7. The semiconductor chip according to claim 5, wherein the benzoxazine component comprises

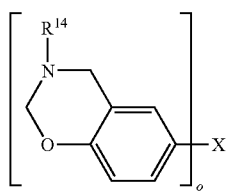

VII wherein o is 1-4, X is a direct bond (when o is 2), alkyl (when o is 1), alkylene (when o is 2-4), carbonyl (when o is 2), thiol (when o is 1), thioether (when o is 2), sulfoxide (when o is 2), and sulfone (when o is 2), and $R^{14}$ is alkyl or aryl.

8. The semiconductor chip according to claim 5, wherein the benzoxazine component comprises

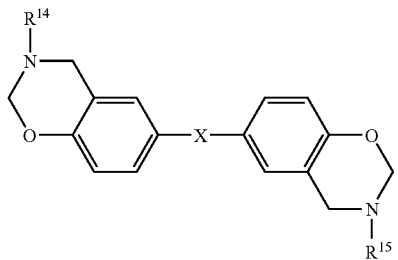

VIII wherein X is selected from the group consisting of a direct bond, $CH_2$, $C(CH_3)_2$, $C=O$, $S=O$ and $O=S=O$, S, and $R^{14}$ and $R^{15}$ are the same or different and are selected from methyl, ethyl, propyls, or butyls and aryl.

9. The semiconductor chip according to claim 5, wherein the benzoxazine component is a member selected from the group consisting of:

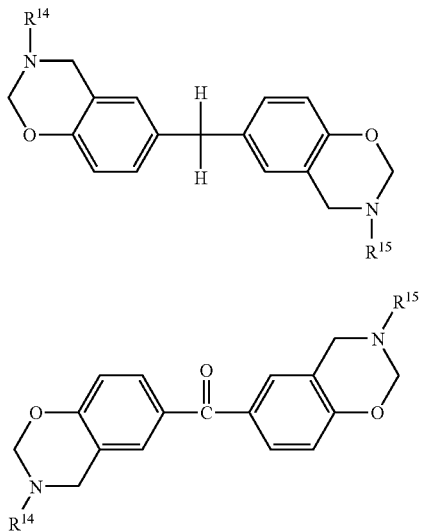

IX

X

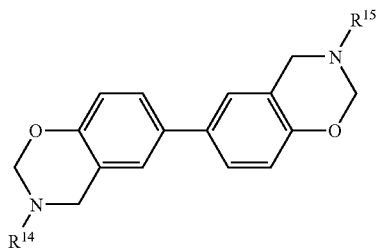

XI

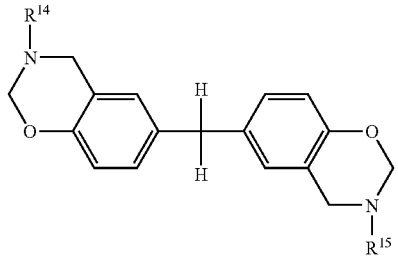

XII

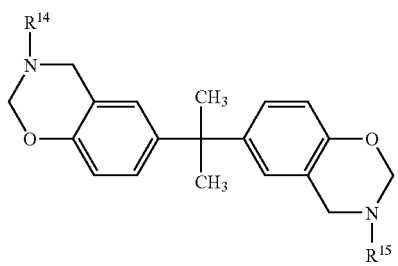

XIII

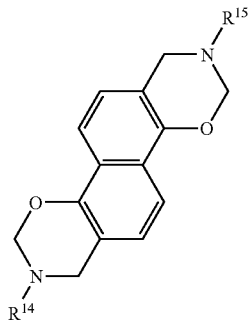

XIV

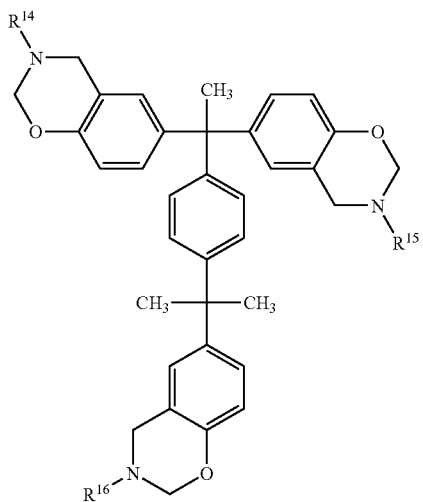

XV

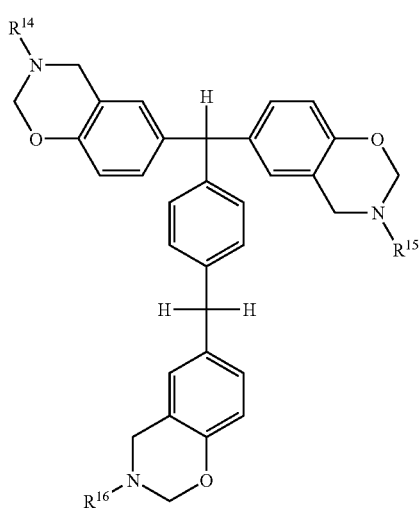
wherein $R^{14}$, $R^{15}$ and $R^{16}$ are the same or different and are members selected from the group consisting of methyl, ethyl, propyls, butyls and aryl.
10. The semiconductor chip according to claim 5, wherein the benzoxazine component is a member selected from the group consisting of:
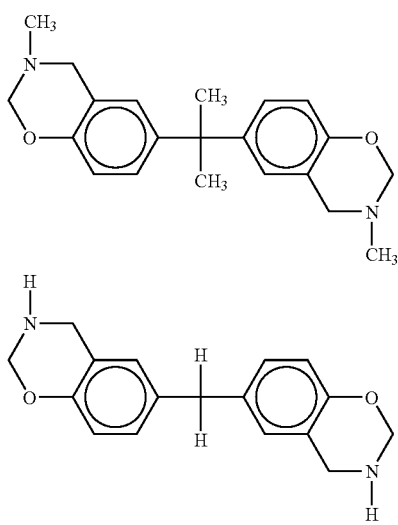
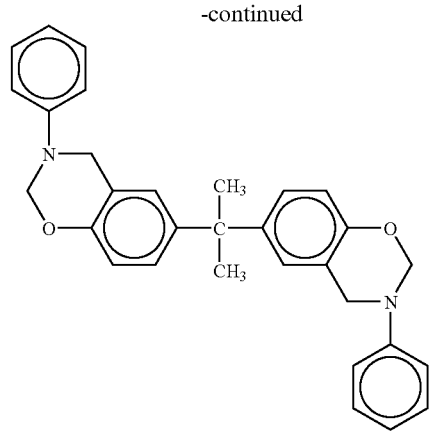
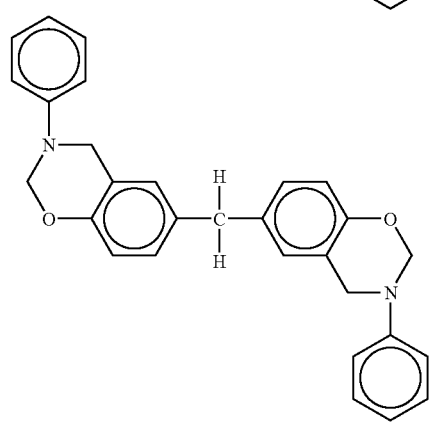
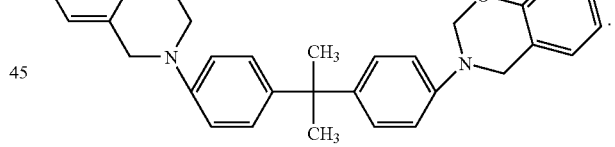
* * * * *